(12) United States Patent
Shibuta

(10) Patent No.: US 10,910,440 B2
(45) Date of Patent: Feb. 2, 2021

(54) IMAGING DEVICE AND IMAGING APPARATUS

(71) Applicant: SONY SEMICONDUCTOR SOLUTIONS CORPORATION, Kanagawa (JP)

(72) Inventor: Hirokazu Shibuta, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/626,018

(22) PCT Filed: Jun. 12, 2018

(86) PCT No.: PCT/JP2018/022327
§ 371 (c)(1),
(2) Date: Dec. 23, 2019

(87) PCT Pub. No.: WO2019/009024
PCT Pub. Date: Jan. 10, 2019

(65) Prior Publication Data
US 2020/0119099 A1   Apr. 16, 2020

(30) Foreign Application Priority Data
Jul. 5, 2017   (JP) .................. 2017-132013

(51) Int. Cl.
*H01L 29/08* (2006.01)
*H01L 35/24* (2006.01)
(Continued)

(52) U.S. Cl.
CPC ........ *H01L 27/307* (2013.01); *H01L 51/4253* (2013.01); *H01L 51/447* (2013.01); *H01L 27/14647* (2013.01)

(58) Field of Classification Search
CPC ............ H01L 27/307; H01L 27/14647; H01L 51/4253; H01L 51/447;
(Continued)

(56) References Cited

U.S. PATENT DOCUMENTS

| | | |
|---|---|---|
| 2011/0228150 A1 | 9/2011 | Takata |
| 2012/0147208 A1 | 6/2012 | Otsuka et al. |

(Continued)

FOREIGN PATENT DOCUMENTS

| | | |
|---|---|---|
| CN | 102569315 A | 7/2012 |
| CN | 104284107 A | 1/2015 |

(Continued)

OTHER PUBLICATIONS

International Search Report and Written Opinion of PCT Application No. PCT/JP2018/022327, dated Sep. 4, 2018, 10 pages of ISRWO.

*Primary Examiner* — Calvin Y Choi
(74) *Attorney, Agent, or Firm* — Chip Law Group

(57) ABSTRACT

An imaging device according to an embodiment of the present disclosure includes: a pixel region in which a plurality of pixels is disposed; a surrounding region provided around the pixel region; an organic photoelectric conversion layer continuously provided from the pixel region to a portion of the surrounding region; an electrically-conducive layer provided on the organic photoelectric conversion layer from a periphery of the pixel region to the surrounding region; and a black layer provided on the electrically-conducive layer. The electrically-conducive layer has a light-shielding property.

10 Claims, 13 Drawing Sheets

(51) Int. Cl.
*H01L 51/00* (2006.01)
*H01L 27/30* (2006.01)
*H01L 51/42* (2006.01)
*H01L 51/44* (2006.01)
*H01L 27/146* (2006.01)

(58) Field of Classification Search
CPC . H01L 31/02162–02165; H01L 51/428; H01L 21/823406; H01L 27/1057; H01L 27/14812; H01L 27/14689; H01L 29/765–76891; H01L 29/66946–66962
See application file for complete search history.

(56) References Cited

U.S. PATENT DOCUMENTS

| | | | |
|---|---|---|---|
| 2015/0001503 A1* | 1/2015 | Hirose | H01L 51/448 257/40 |
| 2015/0194469 A1* | 7/2015 | Joei | H01L 27/14687 257/40 |
| 2016/0072088 A1 | 3/2016 | Hirose | |
| 2016/0190211 A1 | 6/2016 | Joei | |
| 2017/0012229 A1 | 1/2017 | Hirose | |
| 2017/0287960 A1 | 10/2017 | Masuda et al. | |
| 2017/0287982 A1 | 10/2017 | Joei | |

FOREIGN PATENT DOCUMENTS

| | | |
|---|---|---|
| CN | 104396018 A | 3/2015 |
| CN | 105580138 A | 5/2016 |
| JP | 03-148868 A | 6/1991 |
| JP | 09-232552 A | 9/1997 |
| JP | 2006-086493 A | 3/2006 |
| JP | 2011-138927 A | 7/2011 |
| JP | 2011-176325 A | 9/2011 |
| JP | 2011-198855 A | 10/2011 |
| JP | 2012-124377 A | 6/2012 |
| JP | 2015-012239 A | 1/2015 |
| JP | 2016-051746 A | 4/2016 |
| TW | 201230313 A | 7/2012 |
| TW | 201403804 A | 1/2014 |
| WO | 2013/111419 A1 | 8/2013 |
| WO | 2014/007132 A1 | 1/2014 |
| WO | 2016/031592 A1 | 3/2016 |

* cited by examiner

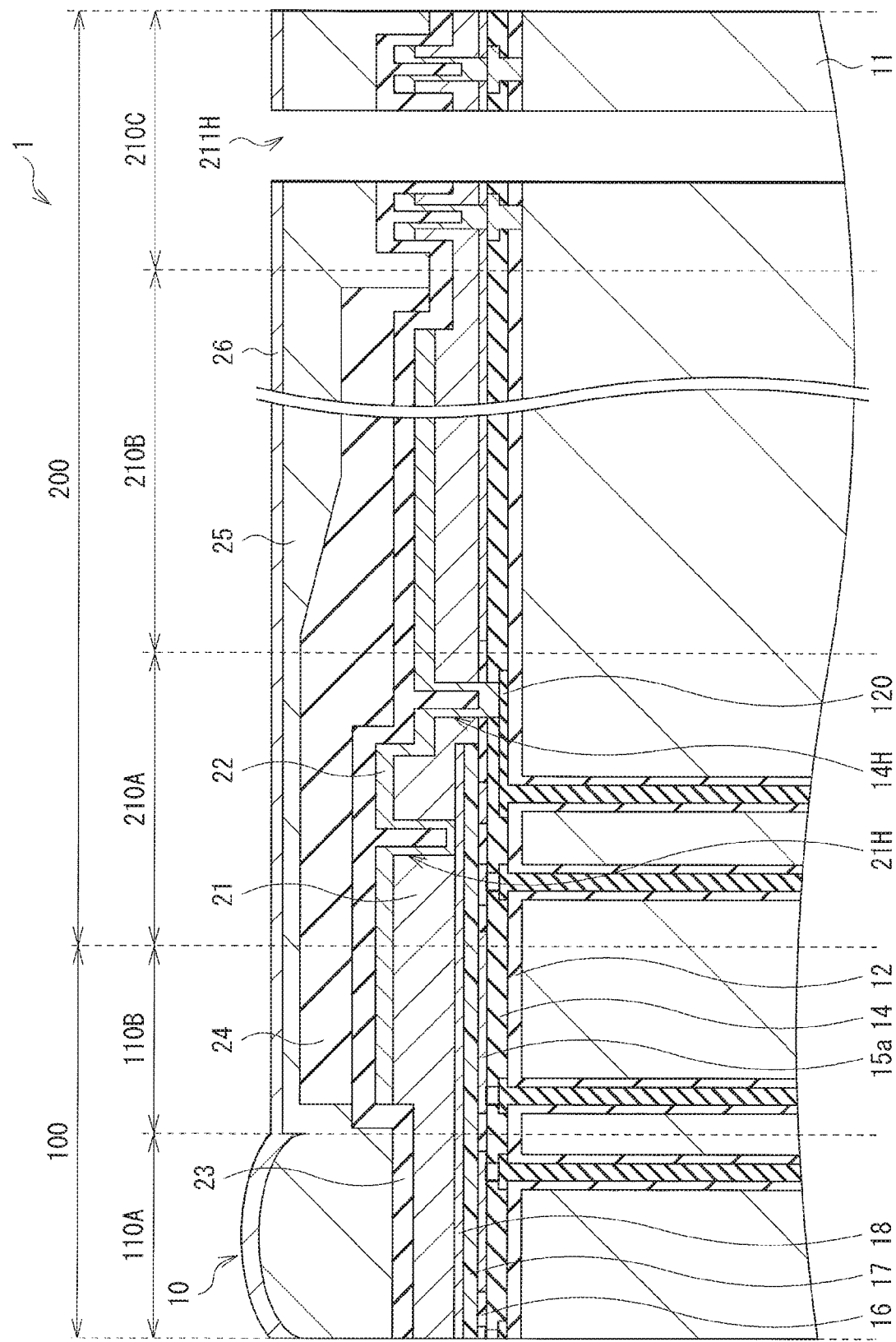
[FIG. 1]

[FIG. 2]
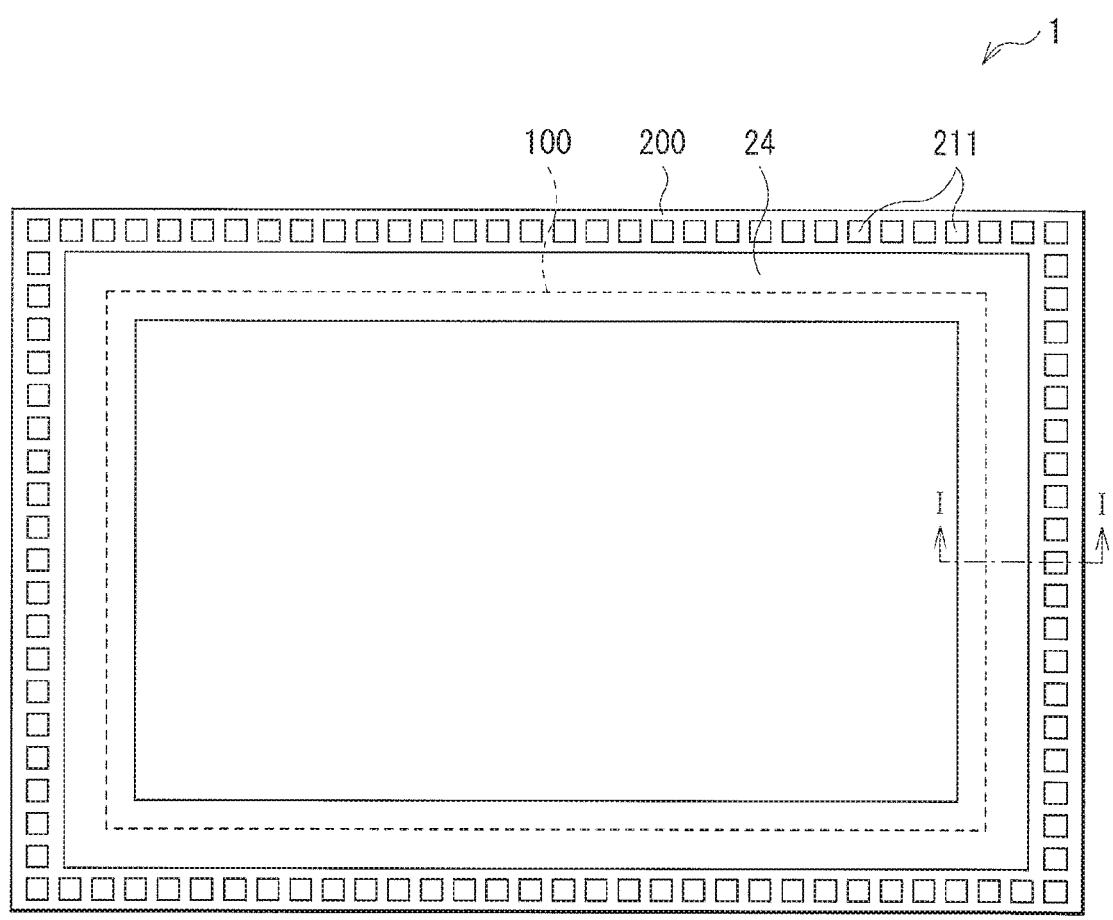

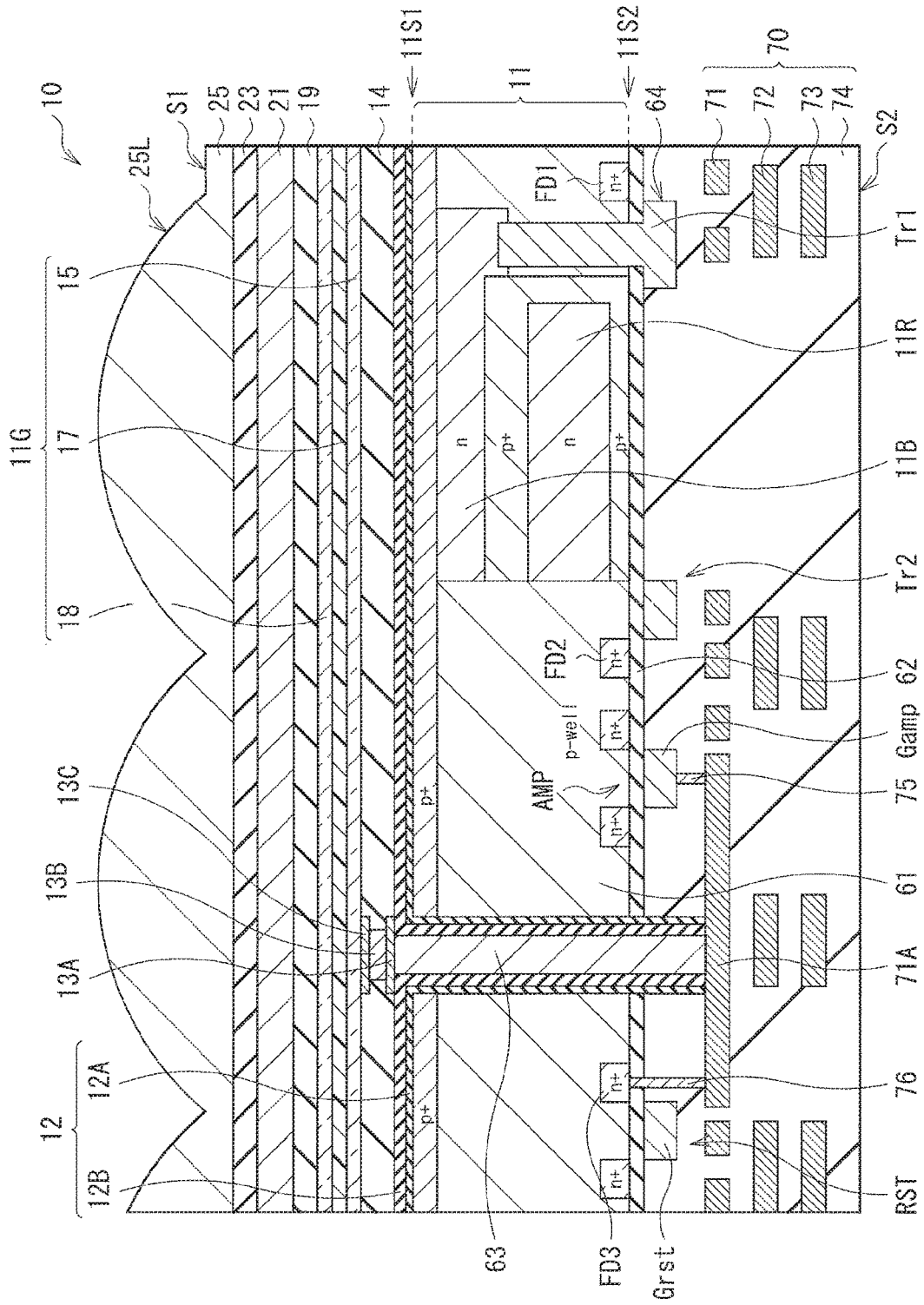
[FIG. 3]

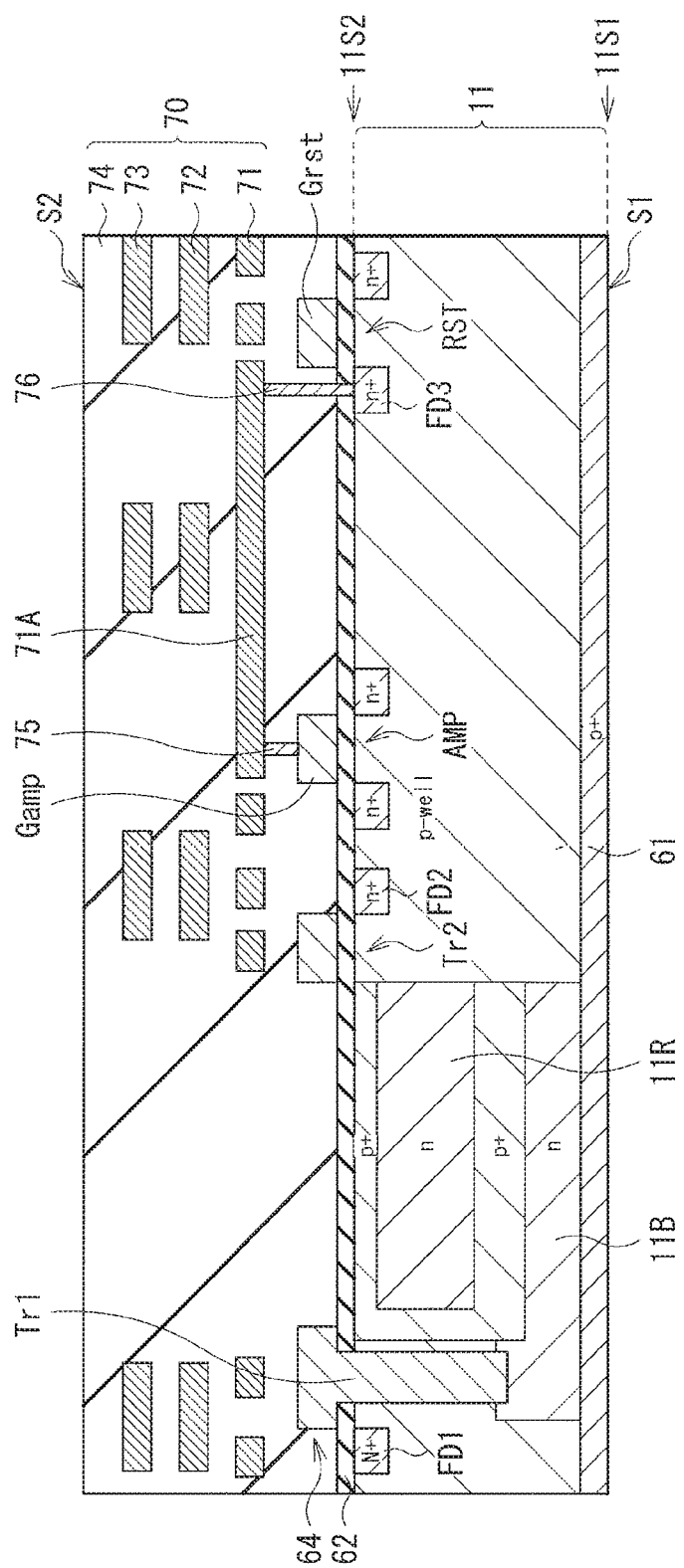
[FIG. 4]

[FIG. 5]
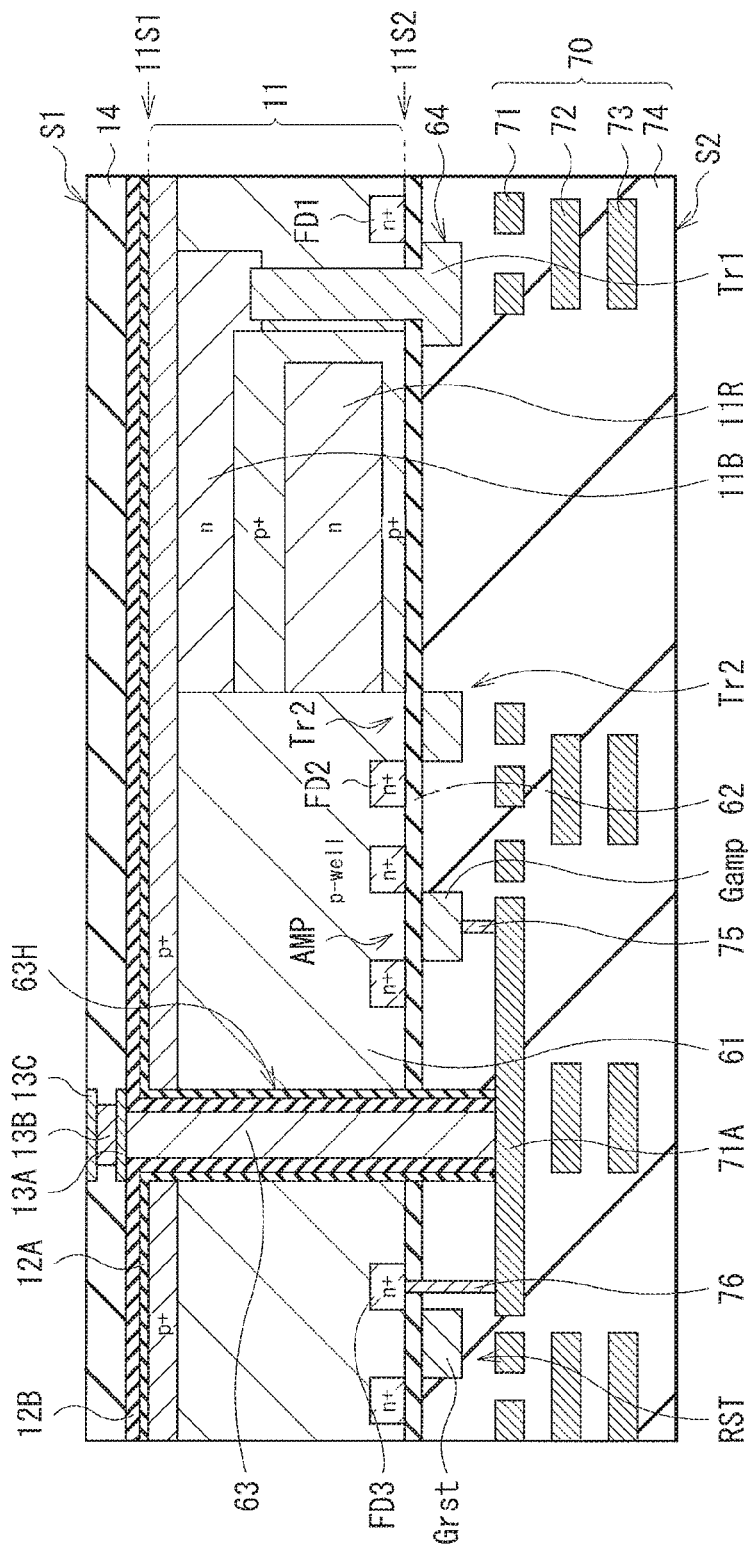

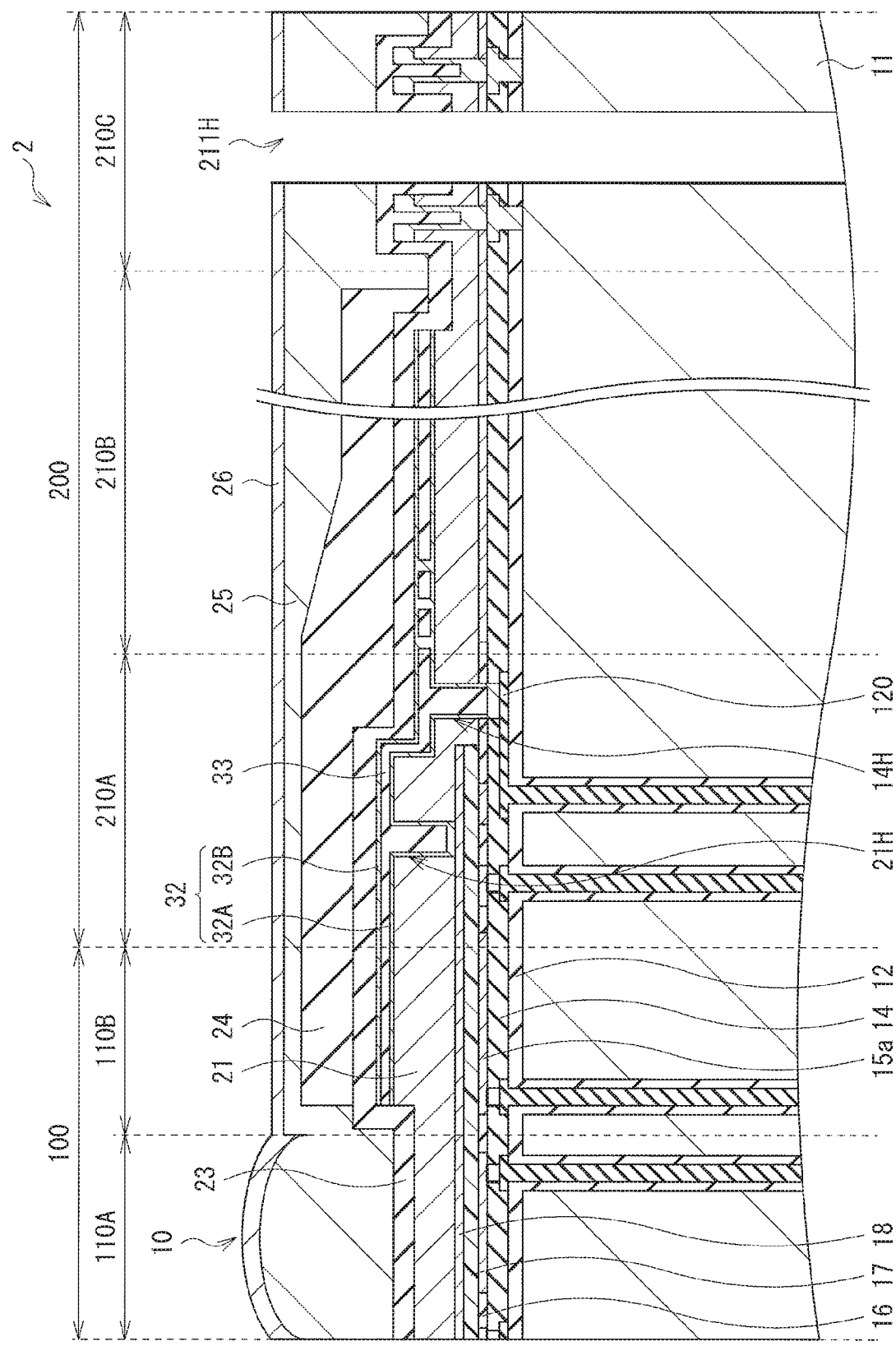
[FIG. 6]

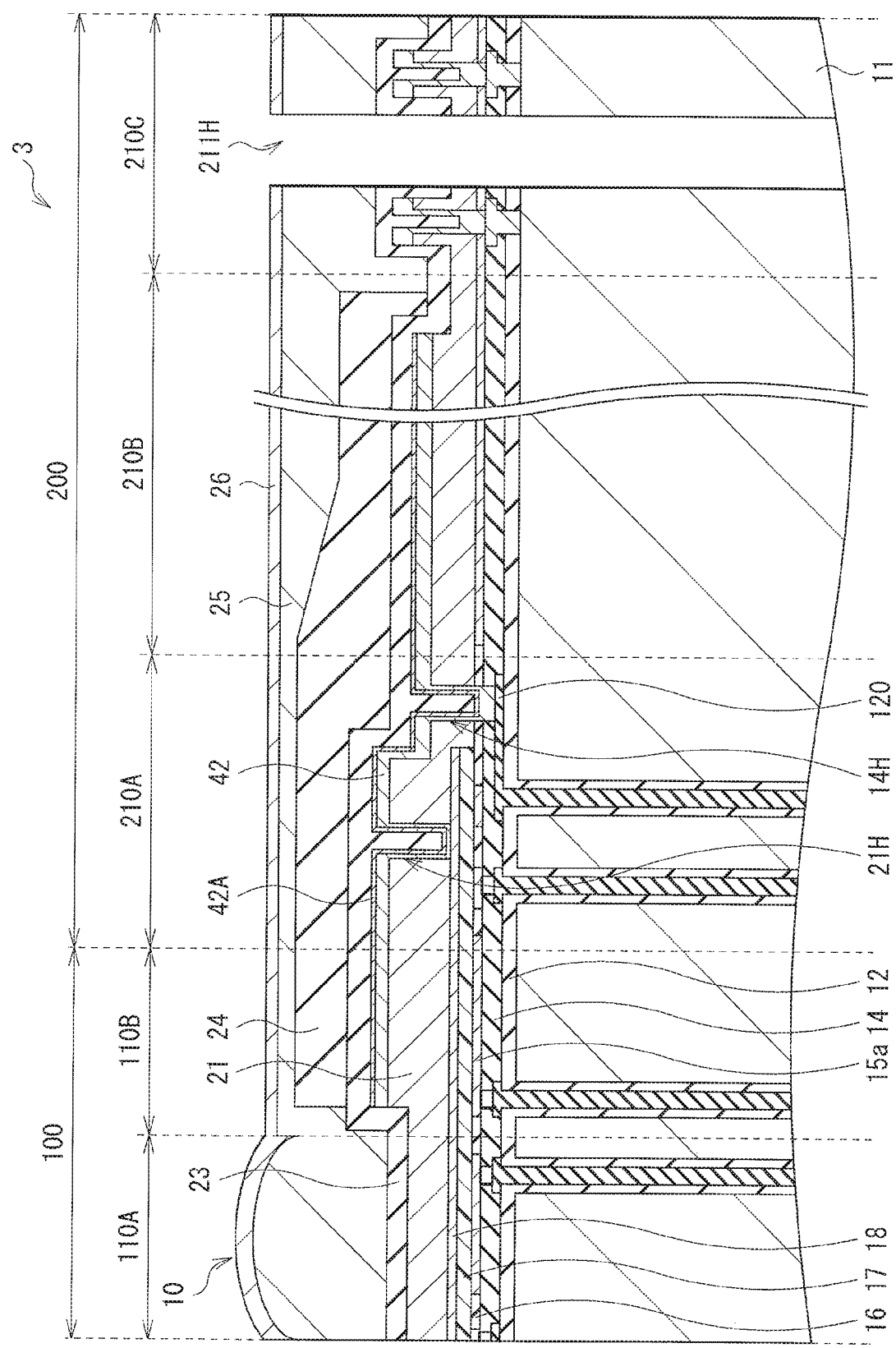

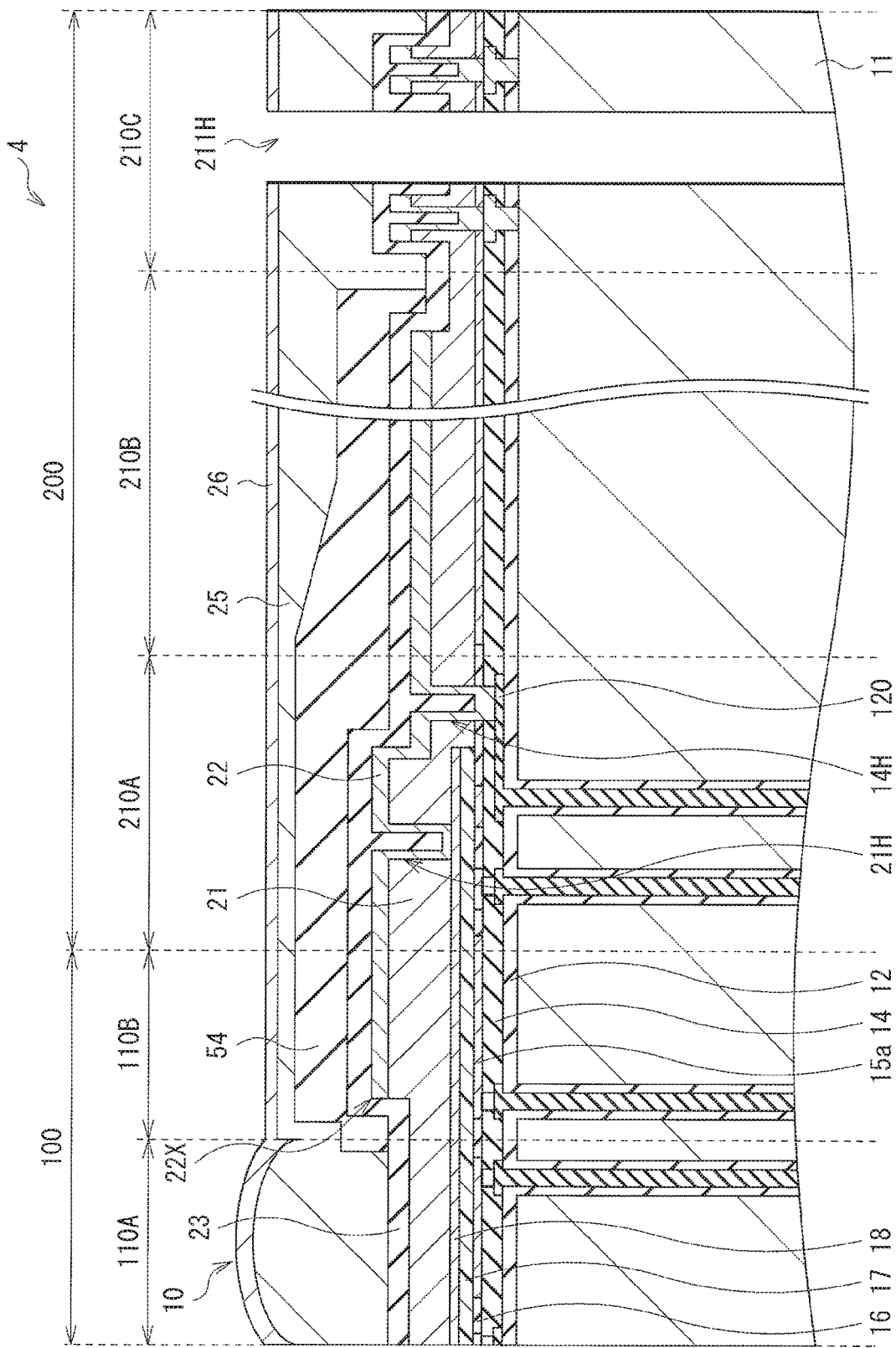

[FIG. 9]
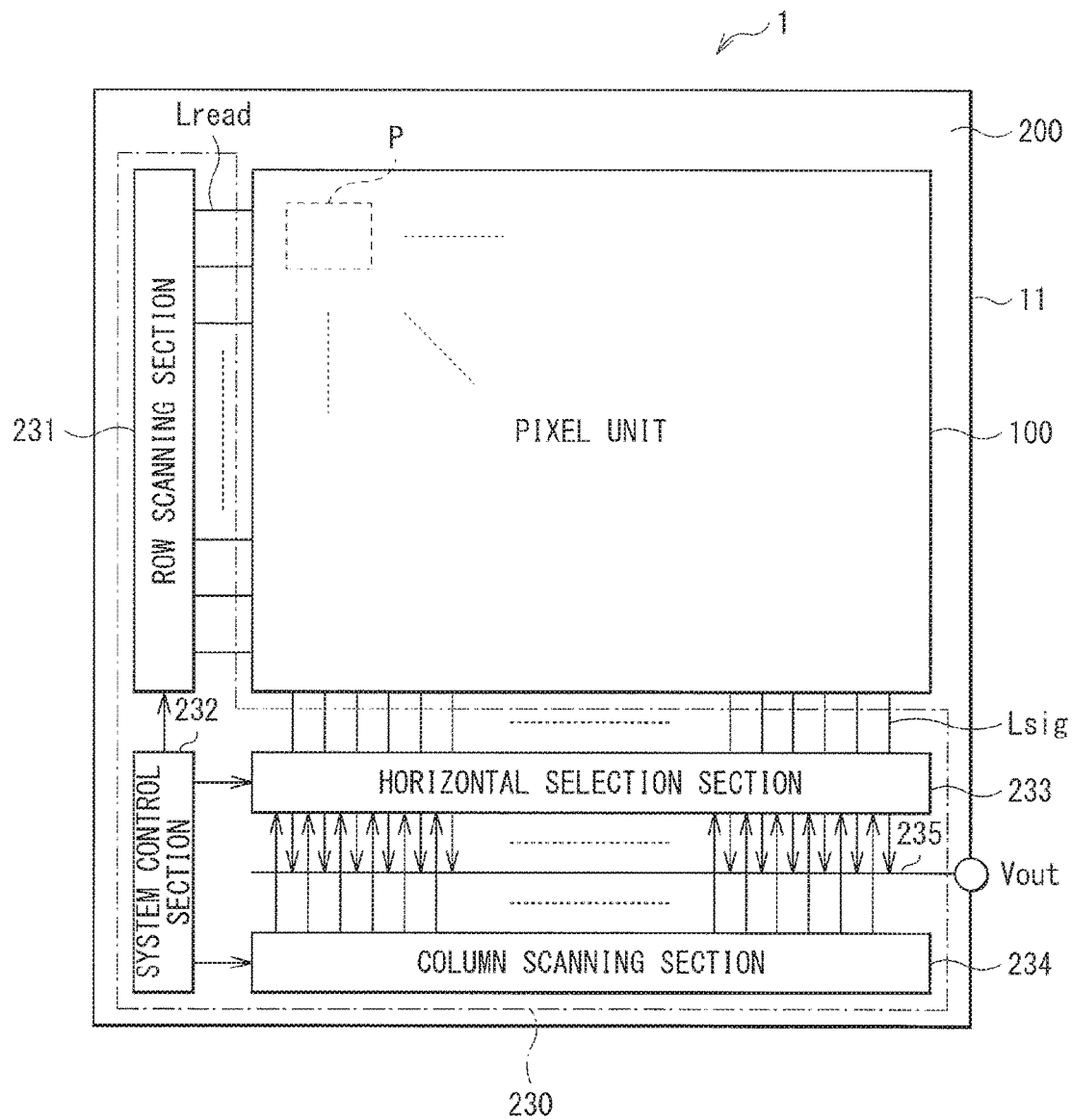

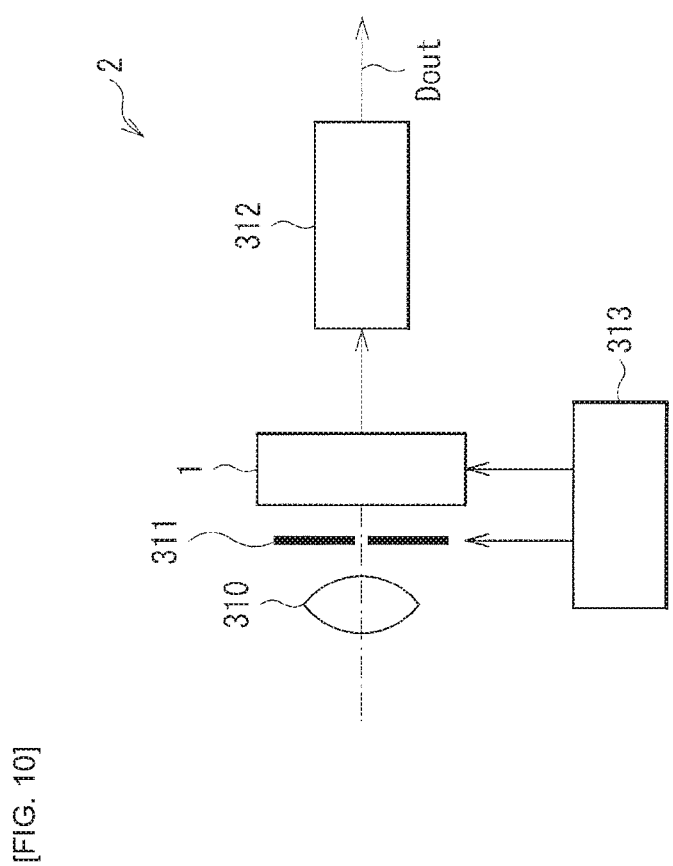
[FIG. 10]

[FIG. 11]
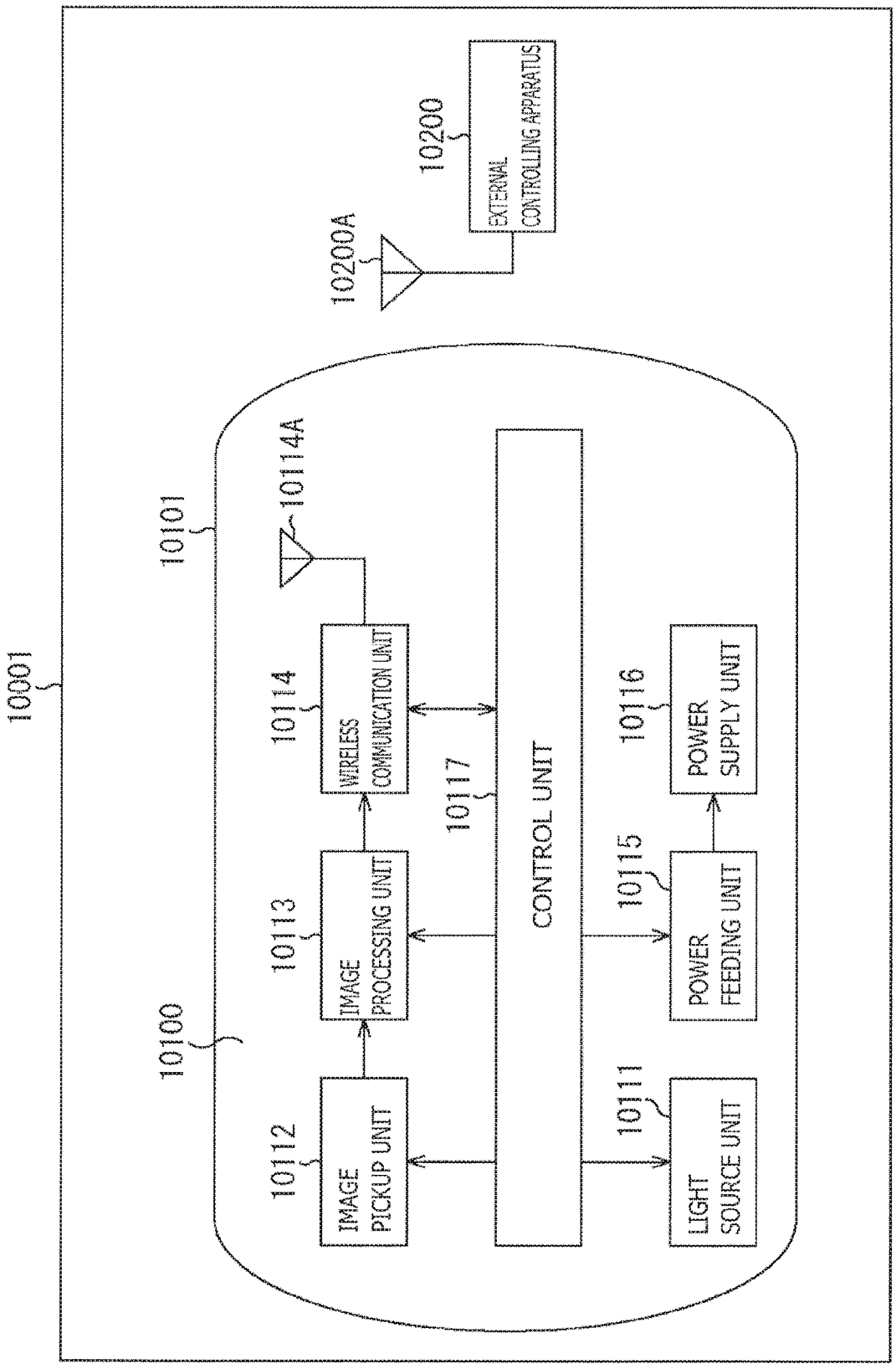

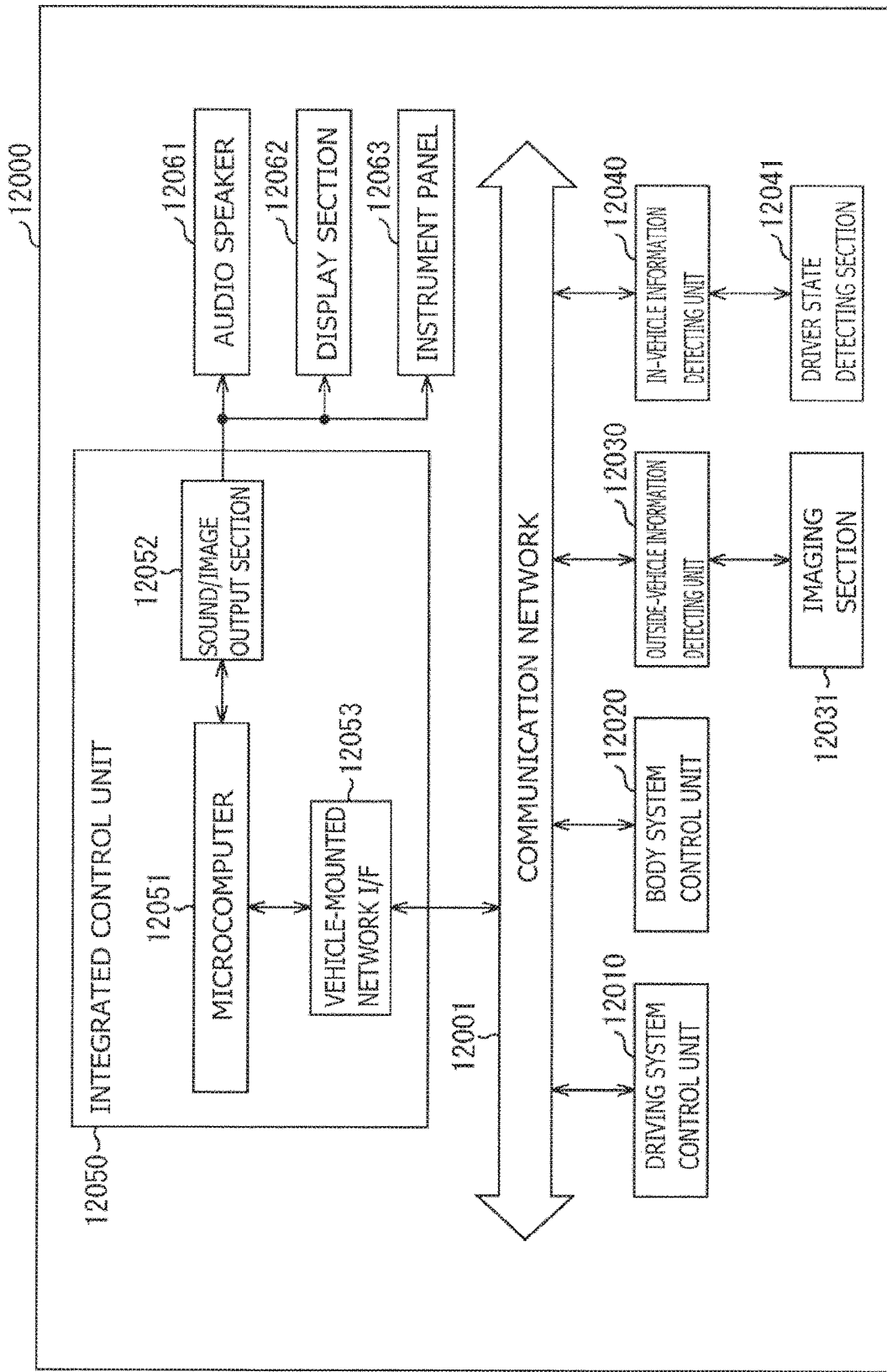

[FIG. 13]
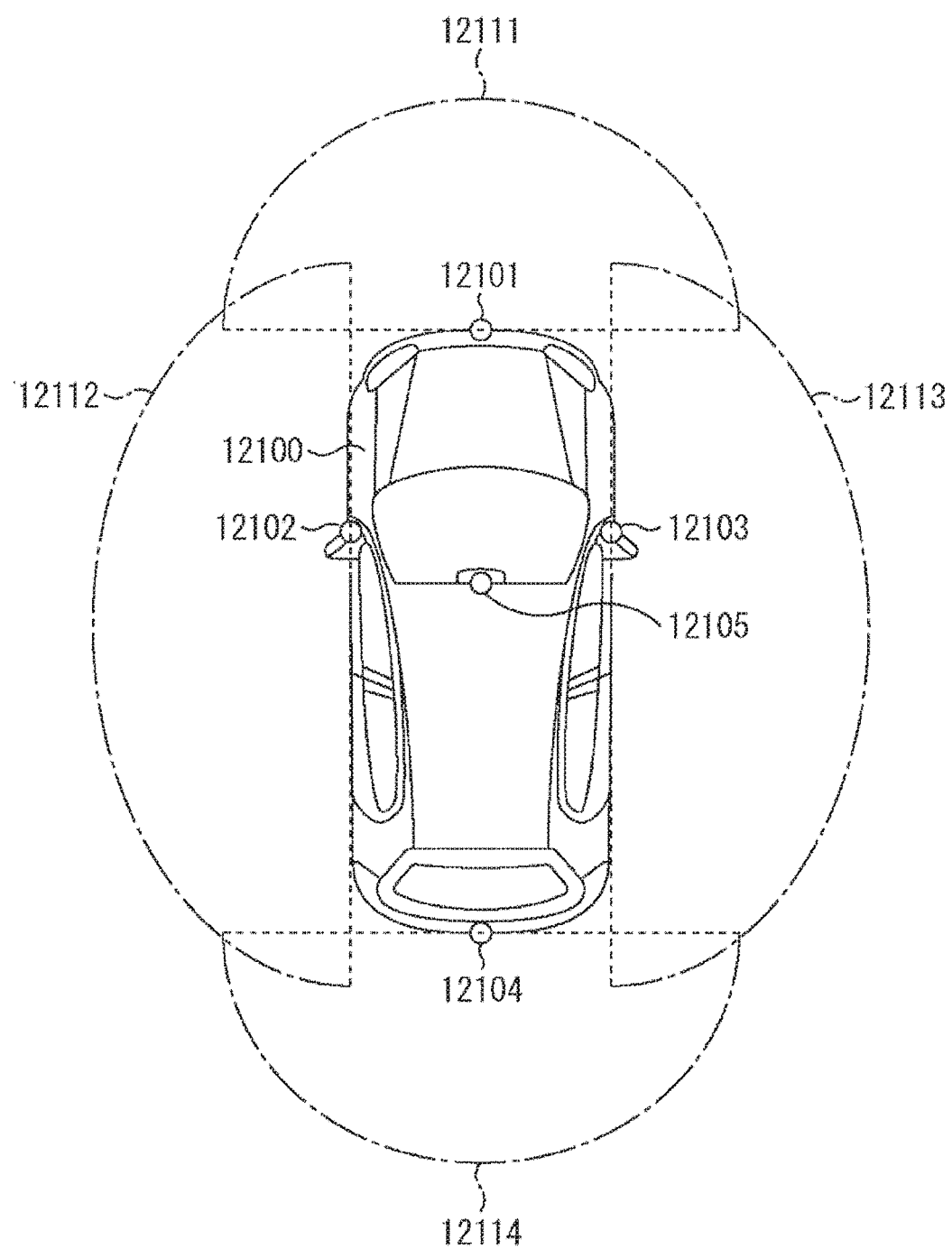

IMAGING DEVICE AND IMAGING APPARATUS

CROSS REFERENCE TO RELATED APPLICATIONS

This application is a U.S. National Phase of International Patent Application No. PCT/JP2018/022327 filed on Jun. 12, 2018, which claims priority benefit of Japanese Patent Application No. JP 2017-132013 filed in the Japan Patent Office on Jul. 5, 2017. Each of the above-referenced applications is hereby incorporated herein by reference in its entirety.

TECHNICAL FIELD

The present disclosure relates to an imaging device including, for example, an organic photoelectric conversion unit and an imaging apparatus including the imaging device.

BACKGROUND ART

In a solid-state imaging device using an organic photoelectric conversion film, for example, a wiring line for applying a voltage to an upper electrode is necessary. Because it is possible to use the wiring line as a light-shielding film for an optical black region (OB region), in terms of light-shielding performance, the wiring line is generally formed to have a film thickness of approximately 250 nm.

However, the organic photoelectric conversion film has weak adhesion to a backing and is easy to peel off due to stress applied when the light-shielding film that is a metal film is formed. Consequently, in PTL 1, for example, a protective layer is provided as a buffer material between a coupling wiring line and the organic photoelectric conversion film including a p-layer, an n-layer, and an electron blocking layer. As the buffer material thickens, however, color mixture occurs because light collected on an on-chip lens enters adjacent pixels before reaching photoelectric conversion units, or vignetting occurs due to the light-shielding film provided between the adjacent pixels. Consequently, there is a concern that optical properties deteriorate such as aggravated shading. In addition, in a case where the organic photoelectric conversion film is used, there is a possibility that flare ghost occurs due to reflection from a metal light-shielding film, although the metal light-shielding film is generally disposed on a layer higher than the organic photoelectric conversion film.

Accordingly, for example, PTL 2 to PTL 4 disclose a solid-state imaging apparatus with the optical properties improved by adjustment of a position at which the light-shielding film is disposed or formation of a flare prevention film.

CITATION LIST

Patent Literature

PTL 1: Japanese Unexamined Patent Application Publication No. 2006-086493
PTL 2: Japanese Unexamined Patent Application Publication No. 2011-138927
PTL 3: Japanese Unexamined Patent Application Publication No. 2011-176325
PTL 4: Japanese Unexamined Patent Application Publication No. 2012-124377

SUMMARY OF THE INVENTION

In this manner, there is a demand for improvement of optical properties in an imaging apparatus.

It is desirable to provide an imaging device and imaging apparatus that make it possible to improve the optical properties.

An imaging device according to an embodiment of the present disclosure includes: a pixel region in which a plurality of pixels is disposed; a surrounding region provided around the pixel region; an organic photoelectric conversion layer continuously provided from the pixel region to a portion of the surrounding region; an electrically-conducive layer provided on the organic photoelectric conversion layer from a periphery of the pixel region to the surrounding region; and a black layer provided on the electrically-conducive layer. The electrically-conducive layer has a light-shielding property.

An imaging apparatus according to an embodiment of the present disclosure includes, as an imaging device, the imaging device of the aforementioned embodiment of the present disclosure.

In the imaging device according to the embodiment of the present disclosure and the imaging apparatus according to the embodiment, the black layer is provided on the electrically-conducive layer. The electrically-conducive layer is provided from the periphery of the pixel region to the surrounding region on the organic photoelectric conversion layer that continues from the pixel region. The electrically-conducive layer has light-shielding properties. This makes it possible to thin a light-shielding layer to lower stress thereof.

In the imaging device according to the embodiment of the present disclosure and the imaging apparatus according to the embodiment, the black layer is further provided on the electrically-conducive layer. The electrically-conducive layer is provided from the periphery of the pixel region to the surrounding region on the organic photoelectric conversion layer. The electrically-conducive layer, has the light-shielding properties. This makes it possible to reduce the thickness of the electrically-conducive layer and lowers the stress of the electrically-conducive layer. Therefore, it is possible to reduce the film thickness of a buffer layer and to improve the optical properties. The buffer layer is provided on the organic photoelectric conversion layer and alleviates the stress of the electrically-conducive layer.

It is to be noted that the effects described here are not necessarily limited, but any of effects described in the present disclosure may be included.

BRIEF DESCRIPTION OF DRAWING

FIG. 1 is a schematic diagram illustrating a cross-sectional configuration of an imaging device according to a first embodiment of the present disclosure.
FIG. 2 is a schematic diagram illustrating a planar configuration of the imaging device illustrated in FIG. 1.
FIG. 3 is a cross-sectional diagram of a photoelectric converter illustrated in FIG. 1.
FIG. 4 is a cross-sectional diagram for describing a method of manufacturing the photoelectric converter illustrated in FIG. 1.
FIG. 5 is a cross-sectional diagram illustrating a process following FIG. 4.

FIG. 6 is a schematic diagram illustrating a cross-sectional configuration of an imaging device according to a second embodiment of the present disclosure.

FIG. 7 is a schematic diagram illustrating a cross-sectional configuration of an imaging device according to a third embodiment of the present disclosure.

FIG. 8 is a schematic diagram illustrating a cross-sectional configuration of an imaging device according to a fourth embodiment of the present disclosure.

FIG. 9 is a functional block diagram of the imaging device illustrated in FIG. 1.

FIG. 10 is a block diagram illustrating a schematic configuration of an imaging apparatus using the imaging device illustrated in FIG. 1.

FIG. 11 is a block diagram depicting an example of a schematic configuration of an in-vivo information acquisition system.

FIG. 12 is a block diagram depicting a schematic configuration example of a vehicle control system.

FIG. 13 is a diagram of assistance in explaining an example of an installation position of an imaging section.

MODES FOR CARRYING OUT THE INVENTION

The following describes embodiments of the present disclosure in detail with reference to the drawings. It is to be noted that description is given in the following order.
1. First Embodiment (An example in which a black layer is provided on a light-shielding layer that is provided on an organic photoelectric conversion layer)
 1-1. Configuration of Imaging Device
 1-2. Configuration of Photoelectric Converter
 1-3. Method of Manufacturing Photoelectric Converter
 1-4. Workings/Effects
2. Second Embodiment (An example in which the light-shielding layer has a two-layer structure)
3. Third Embodiment (An example in which an oxide film is formed on a surface of the light-shielding layer)
4. Fourth Embodiment (An example in which the black layer is protruded toward a pixel effective region side)
5. Application Examples

1. FIRST EMBODIMENT (1-1. Configuration of Imaging Device)

FIG. 1 schematically illustrates a cross-sectional configuration of an imaging device (imaging device 1) according to a first embodiment of the present disclosure. FIG. 2 schematically illustrates a planar configuration of the imaging device 1 illustrated in FIG. 1. The imaging device 1 is, for example, a CCD image sensor, a CMOS image sensor, or the like of a back-illuminated type (back light-receiving type), and has a pixel region (pixel unit 100) in which a plurality of unit pixels P is two-dimensionally disposed on a semiconductor substrate 11 (see FIG. 9). It is to be noted that FIG. 1 illustrates a cross-sectional configuration taken along a line I-I illustrated in FIG. 2. In addition, a photoelectric converter 10 illustrated in FIG. 1 is simplified, and the detailed cross-sectional configuration is illustrated in FIG. 4. In the pixel unit 100, there are provided an effective pixel region 110A and an optical black (OB) region 110B that surrounds the effective pixel region 110A. A surrounding region 200 is provided around the pixel unit 100, and the imaging device 1 has a guidance region 210A, an outer circumferential region 210B, and a pad region 210C from the pixel unit 100 side.

The effective pixel region 110A is provided with a photoelectric converter 10 for each of the unit pixels P (see FIG. 9, for example). The photoelectric converters 10 selectively detect the respective pieces of light in different wavelength ranges and perform photoelectric conversion. The photoelectric converters 10 each include one organic photoelectric conversion unit (organic photoelectric conversion unit 11G) and two inorganic photoelectric conversion units (inorganic photoelectric conversion unit 11B and inorganic photoelectric conversion unit 11R). These three photoelectric conversion units (organic photoelectric conversion unit 11G, inorganic photoelectric conversion unit 11B, and inorganic photoelectric conversion unit 11R) are stacked in a vertical direction. The inorganic photoelectric conversion unit 11B and the inorganic photoelectric conversion unit 11R are embedded and formed in the semiconductor substrate 11. The organic photoelectric conversion unit 11G is provided on a rear surface (light-receiving surface (first surface 11S1)) side of the semiconductor substrate 11. A protective layer 19, a buffer layer 21 (stress buffer layer), and a protective layer 23 are provided on the organic photoelectric conversion unit 11G in this order. An on-chip lens layer 25 and an antireflection layer 26 (omitted in FIG. 3) are formed on the protective layer 23. The on-chip lens layer 25 includes an on-chip lens 25L. A pixel transistor (including transfer transistors Tr1 to Tr3 to be described later) is formed on a front surface (surface (second surface 11S2) side opposite to the light-receiving surface) of the semiconductor substrate 11, and a multilayer wiring layer (multilayer wiring line 70) is included. It is to be noted that a detailed configuration of the photoelectric converter 10 is described later.

The OB region 110B is to output optical black that acts as a reference of black level. In the OB region 110B, on the light-receiving surface (first surface 11S1) side of the semiconductor substrate 11, the buffer layer 21 extends from, for example, the effective pixel region 110A via a lower electrode 15a, an organic photoelectric conversion layer 17, and an upper electrode 18. A light-shielding layer 22 is provided on the buffer layer 21. The protective layer 23 is provided on the light-shielding layer 22. The protective layer 23 extends from the effective pixel region 110A. In the present embodiment, a black layer 24 is provided on this protective layer 23. The on-chip lens layer 25 is provided on the black layer 24. The on-chip lens layer 25 extends from, for example, the effective pixel region 110A. The antireflection layer 26 is provided on the on-chip lens layer 25.

The buffer layer 21 is to alleviate the stress from the light-shielding layer 22 and prevent film peel-off of the organic photoelectric conversion layer 17. The buffer layer 21 preferably has film quality of high passivation performance that suppresses damage to an organic film due to water supplied from outside. Examples of materials of the buffer layer 21 include silicon nitride (SiN), aluminum oxide ($Al_2O_3$), a material mainly that includes silicon and carbon and is expressed by a composition formula SiCO, and the like. It is preferable that the buffer layer 21 have a film thickness (hereinafter simply referred to as thickness) of 200 nm or more and 1000 nm or less, for example, in a stacking direction.

The light-shielding layer 22 is to define the black level and includes an electrically-conductive material having light-shielding properties. Specifically, it is desirable that the light-shielding layer 22 include a single-layer film of a metal material such as tungsten (W), titanium (Ti), titanium nitride (TiN), and aluminum (Al), for example, or a laminated film thereof. Among them, if the light-shielding layer 22 includes Al, it is possible to reduce the thickness of the buffer layer 21. Although the thickness of the light-shielding layer 22 varies depending on a material, it is preferable that the light-shielding layer 22 have a thickness of 50 nm or more and 250 nm or less, for example (by way of example, 50 nm for Al and 250 nm for W). The light-shielding layer 22 is electrically coupled to the upper electrode 18 via a through-hole 21H (contact hole) in, for example, the guidance region 210A to be described later. In addition, the light-shielding layer 22 is electrically coupled to an electrically-conductive film 120 via a through-hole 14H that penetrates an insulating film 16 and an inter-layer insulating layer 14, and also functions as a wiring line for applying a potential to the upper electrode 18.

The protective layer 23 is to prevent corrosion of the electrically-conductive film included in the light-shielding layer 22, and includes an optically transparent material, for example. Specifically, the protective layer 23 includes, for example, the single-layer film including any of silicon nitride (SiN), silicon oxynitride (SiON), and the like, or the laminated film including two or more types thereof. The protective layer 23 has a thickness of 100 nm or more and 500 nm or less, for example.

The black layer 24 is to define the black level together with the light-shielding layer 22 and block input of light into the OB region 110B. It is desirable that a material of the black layer 24 have the light-shielding properties and examples thereof include a photosensitive resin and the like of a black pigment dispersion type including a pigment such as a carbon black, titanium oxide ($TiO_2$), or a multi-color mixed dye. It is preferable that the black layer 24 have a thickness of 200 nm or more and 1000 nm or less, for example. The black layer 24 extends from the OB region 110B to the outer circumferential region 210B, for example. This prevents input of light into the OB region 110B and reflection from the light-shielding layer 22.

The present embodiment has a configuration in which the black layer 24 is provided on the light-shielding layer 22 including the electrically-conductive film, for example, via the protective layer 23. This makes it possible to reduce the thickness of the light-shielding layer 22 and lowers the stress of the light-shielding layer 22. In addition, it is also possible to reduce the thickness of the buffer layer 21 that alleviates the stress of the light-shielding layer 22 to be applied to the organic photoelectric conversion layer 17, thus reducing occurrence of color mixture or shading.

The on-chip lens layer 25 is provided on, for example, the entire light-receiving surface (first surface 11S1) of the semiconductor substrate 11. That is, the on-chip lens layer 25 is continuously provided on the pixel unit 100 and the surrounding region 200. The on-chip lens layer 25 is to planarize the surface. In addition, in the effective pixel region 110A, the on-chip lens 25L is formed on a surface thereof. The on-chip lens layer 25 includes the optically transparent material. Examples of the optically transparent material include a transparent resin material such as acrylic, silicon oxide (SiO), silicon nitride (SiN), silicon oxynitride (SiON), and the like. The on-chip lens layer 25 includes the single-layer film including any of these materials or the laminated film including two or more types thereof.

The antireflection layer 26 is to reduce unintended reflection of light on a surface of the imaging device 1. Examples of materials of the antireflection layer 26 include silicon oxide (SiO) and silicon oxynitride (SiON), and the like.

In the surrounding region 200, as described above, the guidance region 210A, the outer circumferential region 210B, and the pad region 210C are provided from the pixel unit 100 side. For example, the coupling wiring line to the upper electrode 18 is formed in the guidance region 210A. The outer circumferential region 210B is to prevent input of light into the inorganic photoelectric conversion unit 11B and the inorganic photoelectric conversion unit 11R, for example. In the guidance region 210A and the outer circumferential region 210B, the buffer layer 21, the light-shielding layer 22, the protective layer 23, the black layer 24, the on-chip lens layer 25, and the antireflection layer 26 are continuously formed from the OB region 110B. In the outer circumferential region 210B, provision of the light-shielding layer 22 and the black layer 24 reduces the input of the light into the inorganic photoelectric conversion unit 11B and the inorganic photoelectric conversion unit 11R.

In the guidance region 210A, as described above, the light-shielding layer 22 electrically couples the upper electrode 18 and the electrically-conducive layer 120 to each other via the contact hole 21A and the through-hole 14H penetrating to the upper electrode 18 and the electrically-conducive film 120, respectively, and is included in a conductive path for applying the potential to the upper electrode 18.

A contact hall 211H is provided in the pad region 210C. The contact hall 211H penetrates the antireflection layer 26, the on-chip lens layer 25, the protective layer 23, the light-shielding layer 22, the buffer layer 21, the inter-layer insulating layers 14 and 12, and the semiconductor substrate 11 to the front surface (second surface 11S2) of the semiconductor substrate 11. A metal film such as Al is present as a pad portion 211 on a bottom of the contact hall 211H and acts as a voltage application unit from outside.

(1-2. Configuration of Photoelectric Converter)

FIG. 3 illustrates the detailed cross-sectional configuration of the photoelectric converter 10 illustrated in FIG. 1. As described above, the photoelectric converter 10 is of a so-called vertical-direction spectroscopic type in which, for example, the one organic photoelectric conversion unit 11G and the two inorganic photoelectric conversion units 11B and 11R are stacked in the vertical direction. The organic photoelectric conversion unit 11G is provided on the rear surface (first surface 11S1) side of the semiconductor substrate 11. The inorganic photoelectric conversion units 11B and 11R are embedded and formed in the semiconductor substrate 11, and stacked in a thickness direction of the semiconductor substrate 11. The organic photoelectric conversion unit 11G includes a p-type semiconductor and an n-type semiconductor and includes the organic photoelectric conversion layer 17 having a bulk heterojunction structure in a layer. The bulk heterojunction structure is a p/n junction surface formed by mixture of the p-type semiconductor and the n-type semiconductor.

The organic photoelectric conversion unit 11G, the inorganic photoelectric conversion unit 11B, and the inorganic photoelectric conversion unit 11R selectively detect the respective pieces of light having different wavelength bands and perform the photoelectric conversion. Specifically, the organic photoelectric conversion unit 11G acquires a green (G) color signal. The inorganic photoelectric conversion units 11B and 11R respectively acquire a blue (B) color signal and a red (R) color signal, due to a difference in absorption coefficients. This enables the photoelectric converter 10 to acquire a plurality types of color signals in one pixel without using a color filter.

It is to be noted that, in the present embodiment, description is given of a case of reading an electron as a signal charge (case where the n-type semiconductor region is made the photoelectric conversion layer) of a pair of the electron and a hole generated from the photoelectric conversion. In addition, in the diagram, "+(plus)" assigned to "p" and "n" represents that impurity concentration of the p-type or the n-type is high, and "++" represents that the impurity concentration of the p-type or the n-type is even higher than "+".

For example, floating diffusions (floating diffusion layers) FD1, FD2, and FD3, a vertical transistor (transfer transistor) Tr1, a transfer transistor Tr2, an amplification transistor (modulator) AMP, a reset transistor RST, and the multilayer wiring line 70 are provided on the front surface (second surface 11S2) of the semiconductor substrate 11. The multilayer wiring line 70 has a configuration in which wiring layers 71, 72, and 73, for example, are stacked in an insulating layer 74.

It is to be noted that, in the diagram, the first surface 11S1 side of the semiconductor substrate 11 is depicted as a light input side S1 and the second surface 11S2 side is depicted as a wiring layer side S2.

The organic photoelectric conversion unit 11G has a configuration in which, for example, the lower electrode 15, the organic photoelectric conversion layer 17, and the upper electrode 18 are stacked in this order from the first surface 11S1 side of the semiconductor substrate 11. The lower electrode 15 is, for example, separately formed for each photoelectric converter 10. The organic photoelectric conversion layer 17 and the upper electrode 18 are provided as a continuous layer common to the plurality of photoelectric converters 10. Between the first surface 11S1 of the semiconductor substrate 11 and the lower electrode 15, for example, the inter-layer insulating layers 12 and 14 are stacked in this order from the side of the semiconductor substrate 11. The inter-layer insulating layer has a configuration in which, for example, a layer (fixed charge layer) 12A having a fixed charge and a dielectric layer 12B having insulation properties are stacked. The protective layer 19 is provided on the upper electrode 18. The aforementioned buffer layer 21 and the protective layer 23 are provided above the protective layer 19, and the on-chip lens layer 25 included in the on-chip lens 25L is further provided. It is to be noted that the antireflection layer 26 is provided on the on-chip lens layer 25 although not illustrated in FIG. 3.

A through-electrode 63 is provided between the first surface 11S1 and the second surface 11S2 of the semiconductor substrate 11. The organic photoelectric conversion unit 11G is coupled to a gate Gamp of the amplification transistor AMP and the floating diffusion FD3 via this through-electrode 63. This enables the photoelectric converter 10 to transfer charges generated in the organic photoelectric conversion unit 11G on the first surface 11S1 side of the semiconductor substrate 11 via the through-electrode 63 to the second surface 11S2 side of the semiconductor substrate 11 in a favorable manner, thus making it possible to improve properties.

The through-electrode 63 is, for example, provided to each photoelectric converter 10 for each organic photoelectric conversion unit 11G. The through-electrode 63 has a function of a connector for the organic photoelectric conversion unit 11G and the gate Gamp of the amplification transistor AMP, and the floating diffusion FD3, and acts as a transmission path for the charges generated in the organic photoelectric conversion unit 11G.

A lower end of the through-electrode 63 is coupled to a coupled portion 71A in the wiring layer 71, for example, and the coupled portion 71A and the gate Gamp of the amplification transistor AMP are coupled via a first lower contact 75. The coupled portion 71 and the floating diffusion FD3 are coupled to the lower electrode 15 via a second lower contact 76. It is to be noted that, although FIG. 3 illustrates the through-electrode 63 in the shape of a cylinder, the through-electrode 63 is not limited thereto, but may have a tapered shape, for example.

It is preferable that, as illustrated in FIG. 3, a reset gate Grst of the reset transistor RST be disposed next to the floating diffusion FD3. This makes it possible to cause the reset transistor RST to reset the charges accumulated in the floating diffusion FD3.

In the photoelectric converter 10 of the present embodiment, light inputted to the organic photoelectric conversion unit 11G from the upper electrode 18 side is absorbed by the organic photoelectric conversion layer 17. Excitons generated by this move to a boundary surface between an electron donor and an electron acceptor included in the organic photoelectric conversion layer 17, and separate, that is, disassociate to electrons and holes. Charges (electrons and holes) generated here are each carried to a different electrode due to diffusion caused by a difference in concentration of carriers or an internal electric field caused by a difference in work functions of a positive electrode (upper electrode 18 here) and a negative electrode (lower electrode 15 here), and detected as a photocurrent. In addition, application of the potential between the lower electrode 15 and the upper electrode 18 makes it possible to control a transport direction of the electrons and the holes.

In the following, description is given of configurations or materials of respective units.

The organic photoelectric conversion unit 11G is an organic photoelectric converter that absorbs the green light corresponding to a portion or all of selective wavelength bands (450 nm or more and 650 nm or less, for example) to generate an electron-hole pair.

The lower electrode 15 is provided in a region that is directly faces light-receiving surfaces of the inorganic photoelectric conversion units 11B and 11R formed in the semiconductor substrate 11 and covers these light receiving surfaces. The lower electrode 15 includes an optically transparent electrically-conducive layer and includes, for example, ITO (indium-tin oxide). However, as a material included in the lower electrode 15, a tin oxide ($SnO_2$)-based material obtained by adding a dopant or a zinc oxide-based material formed by adding a dopant to aluminum zinc oxide (ZnO) may be used in addition to this ITO. Examples of the zinc oxide-based materials include aluminum zinc oxide (AZO) obtained by adding aluminum (Al) as the dopant, gallium (Ga)-added gallium zinc oxide (GZO), and indium (In)-added indium zinc oxide (IZO). In addition to these, CuI, $InSbO_4$, ZnMgO, $CuInO_2$, $MgIN_2O_4$, CdO, $ZnSnO_3$, or the like may also be used.

The organic photelectric conversion layer 17 is to convert optical energy into electric energy. As described above, the organic photoelectric conversion layer 17 includes, for example, three types of organic semiconductor materials that function as the p-type semiconductor or the n-type semiconductor. Any of the three types of organic semiconductor materials is one or both of an organic p-type semiconductor and an organic n-type semiconductor, and photoelectrically convers the light in the selective wavelength range (450 nm or more and 650 nm or less, for example) and, meanwhile, transmits light in another wavelength range.

The organic photoelectric conversion layer 17 has the junction surface (p/n junction surface) between these p-type semiconductor and n-type semiconductor in the layer. The p-type semiconductor relatively functions as the electron donor (donor) and the n-type semiconductor relatively functions the electron acceptor (acceptor). The organic photoelectric conversion layer 17 provides a field where the excitons generated when light is absorbed separate into the electrons and the holes. Specifically, the excitons separate into the electrons and the holes on the boundary surface (p/n junction surface) between the electron donor and the electron acceptor. The organic photoelectric conversion layer 17 has a thickness of 50 nm to 500 nm, for example.

The upper electrode 18 includes the electrically-conductive film having optical transparency similar to that of the lower electrode 15. In the imaging device 1 that uses the photoelectric converter 10 as one pixel, this upper electrode 18 may be separated on a pixel basis or may be formed as an electrode common to the respective pixels. The upper electrode 18 has a thickness of 10 nm to 200 nm, for example.

It is to be noted that another layer may be provided between the organic photoelectric conversion layer 17 and the lower electrode 15 and between the organic photoelectric conversion layer 17 and the upper electrode 18. Specifically, for example, an undercoating film, a hole transport layer, an electron blocking film, the organic photoelectric conversion layer 17, a hole blocking film, a buffer film, an electron transport layer, a work function adjustment film, and the like may be stacked in order from the lower electrode 15 side.

The fixed charge layer 12A may be a film having a positive fixed charge or a film having a negative fixed charge. As materials of the film having the negative fixed charge, hafnium oxide, aluminum oxide, zirconium oxide, tantalum oxide, titanium oxide, and the like are included. In addition, as materials other than the aforementioned materials, lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, an aluminum oxynitride film, or the like may be used.

The fixed charge layer 12A may also have a configuration in which two or more types of films are stacked. This makes it possible to further improve a function of a hole accumulation layer in the case of a film having the negative fixed charge, for example.

Although materials of the dielectric layer 12B are not limited in particular, the dielectric layer 12B includes a silicon oxide film, TEOS, a silicon nitride film, a silicon oxynitride film, or the like, for example.

The inter-layer insulating layer 14 includes the single-layer film including one type of, for example, silicon oxide, silicon nitride, silicon oxynitride (SiON), and the like, or the laminated film including two or more types thereof.

The protective layer 19 includes the optically transparent materials, and includes, for example, the single-layer film including any of silicon oxide, silicon nitride, silicon oxynitride, and the like, or the laminated film including two or more types thereof. This protective layer 19 has a thickness of 100 nm to 30000 nm, for example.

On the protective layer 23, the on-chip lens layer 25 is formed to cover the entire surface thereof. The plurality of on-chip lenses 25L (micro-lenses) is provided on a surface of the on-chip lens layer 25. The on-chip lenses 25L cause light inputted from thereabove to focus on the respective light-receiving surfaces of the organic photoelectric conversion unit 11G, and the inorganic photoelectric conversion units 11B and 11R. In the present embodiment, because the multilayer wiring line 70 is formed on the second surface 11S2 side of the semiconductor substrate 11, it is possible to dispose the respective light-receiving surfaces of the organic photoelectric conversion unit 11G and the inorganic photoelectric conversion units 11B and 11R close to each other, thus allowing for reduction of fluctuations in sensitivity among the respective colors. The fluctuations are generated depending on an F value of the on-chip lens 25L.

It is to be noted that the on-chip lens 25L does not necessarily have to be provided in the OB region 110B and may be omitted as appropriate. In addition, although FIG. 1 illustrates an example in which the organic photoelectric conversion unit 11G is continuously provided from the effective pixel region 110A in the OB region 110B, the inorganic photoelectric conversion unit 11B and the inorganic photoelectric conversion unit 11R may also be provided, for example, as a dummy pixel together with the organic photoelectric conversion unit 11G. In addition, for example, in a case where a color filter is provided in the effective pixel region 110A, it is preferable that the color filter be provided between the protective layer 23 and the on-chip lens layer 25.

The semiconductor substrate 11 includes, for example, an n-type silicon (Si) substrate and has a p-well 61 in a predetermined region. On the second surface 11S2 of the p-well 61, the vertical transistor Tr1, transfer transistor Tr2, amplification transistor AMP, reset transistor RST, and the like described above are provided. In addition, in a peripheral portion of the semiconductor substrate 11, a peripheral circuit (not illustrated) including a logic circuit or the like is provided.

Each of the inorganic photoelectric conversion units 11B and 11R has a p-n junction in a predetermined region of the semiconductor substrate 11. The inorganic photoelectric conversion units 11B and 11R make it possible to disperse light in the vertical direction by utilizing the fact that wavelengths of light to be absorbed vary depending on a depth of light input into the silicon substrate. The inorganic photoelectric conversion unit 11B selectively detects the blue light to accumulate the signal charge corresponding to blue and is installed at a depth at which efficient photoelectric conversion of the blue light is possible. The inorganic photoelectric conversion unit 11R selectively detects the red light to accumulate the signal charge corresponding to red and is installed at a depth at which efficient photoelectric conversion of the red light is possible. It is to be noted that blue (B) and red (R) are colors respectively corresponding to a wavelength band of, for example, 350 nm to 495 nm and a wavelength band of, for example, 620 nm to 750 nm. It is sufficient if the inorganic photoelectric conversion units 11B and 11R are able to detect light of a portion or all of the respective wavelength bands.

The inorganic photoelectric conversion unit 11B has, for example, a p+ region that is a hole accumulation layer, and an n region that is an electron accumulation layer. The inorganic photoelectric conversion unit 11R has, for example, a p+ region that is a hole accumulation layer, and an n region that is an electron accumulation layer (has a p-n-p stacked structure). The n region of the inorganic photoelectric conversion unit 11B is coupled to the vertical transistor Tr1. The p+ region of the inorganic photoelectric conversion unit 11B bends along the vertical transistor Tr1 and links to the p+ region of the inorganic photoelectric conversion unit 11R.

The vertical transistor Tr1 is a transfer transistor that transfers, to the floating diffusion FD1, the signal charge (electron, here) generated and accumulated in the inorganic photoelectric conversion unit 11B and corresponding to blue. The inorganic photoelectric conversion unit 11B is formed at a deep position from the second surface 11S2 of the semiconductor substrate 11, and thus it is preferable that the transfer transistor of the inorganic photoelectric conversion unit 11B include the vertical transistor Tr1.

The transfer transistor Tr2 transfers, to the floating diffusion FD2, the signal charge (electron, here) generated and accumulated in the inorganic photoelectric conversion unit 11R and corresponding to red, and includes a MOS transistor, for example.

The amplification transistor AMP is a modulator that modulates, into a voltage, an amount of the charges generated in the organic photoelectric conversion unit 11G, and includes a MOS transistor, for example.

The reset transistor RST resets the charges transferred from the organic photoelectric conversion unit 11G to the floating diffusion FD3, and includes a MOS transistor, for example.

The first lower contact 75, the second lower contact 76, and an upper contact 13 each include, for example, a doped silicon material such as PDAS (Phosphorus Doped Amorphous Silicon), or a metal material such as aluminum (Al), tungsten (W), titanium (Ti), cobalt (Co), hafnium (Hf), or tantalum (Ta).

(1-3. Method of Manufacturing Photoelectric Converter)

It is possible to manufacture the photoelectric converter 10 of the present embodiment, for example, in the following manner.

FIG. 4 and FIG. 5 illustrate the method of manufacturing the photoelectric converter 10 in order of processes. First, as illustrated in FIG. 4, the p-well 61, for example, is formed as a first electrically-conductive well in the semiconductor substrate 11. The second electrically-conductive (n-type, for example) inorganic photoelectric conversion units 11B and 11R are formed in this p-well 61. The p+ region is formed in the vicinity of the first surface 11S1 of the semiconductor substrate 11.

As also illustrated in FIG. 4, on the second surface 11S2 of the semiconductor substrate 11, after the n+ regions serving as the floating diffusions FD1 to FD3, are formed, a gate insulating layer 62 and a gate wiring layer 64 including the respective gates of the vertical transistor Tr1, the transfer transistor Tr2, the amplification transistor AMP, and the reset transistor RST are formed. This forms the vertical transistor Tr1, the transfer transistor Tr2, the amplification transistor AMP, and the reset transistor RST. Furthermore, the multilayer wiring line 70 is formed on the second surface 11S2 of the semiconductor substrate 11. The multilayer wiring line 70 includes wiring layers 71 to 73 and the insulating layer 74. The wiring layers 71 to 73 include the first lower contact 75, the second lower contact 76, and the coupled portion 71A.

As a base of the semiconductor substrate 11, for example, an SOI (Silicon on Insulator) substrate is used in which the semiconductor substrate 11, an embedded oxide film (not illustrated), and a holding substrate (not illustrated) are stacked. Although not illustrated in FIG. 4, the embedded oxide film and the holding substrate are joined to the first substrate surface 11S1 of the semiconductor substrate 11. After ion implantation, annealing processing is performed.

Then, a support substrate (not illustrated), another semiconductor substrate, or the like is joined to the second surface 11S2 side (the multilayer wiring line 70 side) of the semiconductor substrate 11 and flipped vertically. Subsequently, the semiconductor substrate 11 is separated from the embedded oxide film and the holding substrate of the SOI substrate to expose the first surface 11S1 of the semiconductor substrate 11. It is possible to perform the aforementioned processes with a technology used in a normal CMOS process such as the ion implantation and CVD (Chemical Vapor Deposition).

Then, as illustrated in FIG. 5, the semiconductor substrate 11 is processed from the first surface 11S1 side with dry etching, for example, to form an annular opening 63H. The opening 63H has a depth penetrating from the first surface 11S1 to the second surface 11S2 of the semiconductor substrate 11 as illustrated in FIG. 5, and reaching the coupled portion 71A, for example.

Subsequently, as illustrated in FIG. 5, for example, the negative fixed charge layer 12A is formed on the first surface 11S1 of the semiconductor substrate 11 and a side face of the opening 63H. Two or more types of films may be stacked as the negative fixed charge layer 12A. This makes it possible to further improve the function as the hole accumulation layer. The dielectric layer 12B is formed after the negative fixed charge layer 12A is formed.

Next, an electric conductor is buried in the opening 63H to form the through-electrode 63. As the electric conductor, for example, the metal material such as aluminum (Al), tungsten (W), titanium (Ti), cobalt (Co), hafnium (Hf), tantalum (Ta), and the like is usable in addition to the doped silicon material such as PDAS (Phosphorus Doped Amorphous Silicon).

Subsequently, after a pad portion 13A is formed on the through-electrode 63, the inter-layer insulating layer 14 is formed on the dielectric layer 12B and the pad portion 13A. In the inter-layer insulating layer 14, the first upper contact 13B and a pad portion 13C are provided on the pad portion 13A. The first upper contact 13B and the pad portion 13C electrically couple the lower electrode 15 and the through-electrode 63 (specifically, the pad portion 13A on the through-electrode 63) to each other.

Next, the lower electrode 15, the organic photoelectric conversion layer 17, the upper electrode 18, and the protective layer 19 are formed in this order on the inter-layer insulating layer 14. For the organic photoelectric conversion layer 17, films of the aforementioned three types of organic semiconductor materials are formed by using a vacuum deposition method, for example. Lastly, the buffer layer 21, the protective layer 23, and the on-chip lens layer 25 are disposed. With the above, the photoelectric converter 10 illustrated in FIG. 3 is complete.

It is to be noted that, as described above, in a case where another organic layer (electron blocking layer, etc., for example) is formed on an upper layer or a lower layer of the organic photoelectric conversion layer 17, continuous formation in a vacuum process (in a vacuum continuous process) is desirable. In addition, a film formation method of the organic photoelectric conversion layer 17 is not necessarily limited to an approach using the vacuum deposition method, but any other methods such as a spin coating technology or a printing technology may also be used.

In the photoelectric converter 10, when light is inputted into the organic photoelectric conversion unit 11G via the on-chip lens 25L, the light passes through the organic photoelectric conversion unit 11G, and the inorganic photoelectric conversion units 11B and 11R in this order, and in the course of the passage, the photoelectric conversion takes place for each of the green, blue, and red light. In the following, description is given of an acquisition operation of each of the color signals.

(Acquisition of Green Color Signal by Organic Photoelectric Conversion Unit 11G)

Of the light inputted into the photoelectric converter 10, first, the green light is selectively detected (absorbed) and photoelectrically converted by the organic photoelectric conversion unit 11G.

The organic photoelectric conversion unit 11G is coupled to a gate Gamp of the amplification transistor AMP and the floating diffusion FD3 via the through-electrode 63. Thus, the electron of the electron-hole pair generated in the organic photoelectric conversion unit 11G is taken out from the lower electrode 15 side, transferred to the second surface 11S2 side of the semiconductor substrate 11 via the through-electrode 63, and accumulated in the floating diffusion FD3. Simultaneously with this, the amplification transistor AMP modulates the amount of the charges generated in the organic photoelectric conversion unit 11G into the voltage.

In addition, the reset gate Grst of the reset transistor RST is disposed next to the floating diffusion FD3. This causes the reset transistor RST to reset the charges accumulated in the floating diffusion FD3.

Here, the organic photoelectric conversion unit 11G is coupled to not only the amplification transistor AMP, but also the floating diffusion FD3 via the through-electrode 63, thus making it possible for the reset transistor RST to easily reset the charges accumulated in the floating diffusion FD3.

In contrast to this, in a case where the through-electrode 63 and the floating diffusion FD3 are not coupled, it is difficult to reset the charges accumulated in the floating diffusion FD3 and the charges are pulled out to the upper electrode 18 side by application of a large voltage. Therefore, there is a possibility that the organic photoelectric conversion layer 17 is be damaged. Moreover, a structure that enables resetting in a short period of time leads to increased dark-time noise and results in a trade-off. Thus, this structure is difficult.

(Acquisition of Blue Color Signal and Red Color Signal by Inorganic Photoelectric Conversion Units 11B and 11R)

Subsequently, of the light passing through the organic photoelectric conversion unit 11G, the blue light and the red light are absorbed in sequence and photoelectrically converted respectively in the inorganic photoelectric conversion unit 11B and the inorganic photoelectric conversion unit 11R. In the inorganic photoelectric conversion unit 11B, electrons corresponding to the inputted blue light are accumulated in the n-region of the inorganic photoelectric conversion unit 11B and the accumulated electrons are transferred to the floating diffusion FD1 by the vertical transistor Tr1. Similarly, in the inorganic photoelectric conversion unit 11R, electrons corresponding to the inputted red light are accumulated in the n-region of the inorganic photoelectric conversion unit 11R and the accumulated electrons are transferred to the floating diffusion FD2 by the transfer transistor Tr2.

(1-4. Workings/Effects)

As described earlier, the wiring line for applying the voltage to the upper electrode is provided in the solid-state imaging device using the organic photoelectric conversion film. Forming the wiring line by using the material having the light-shielding properties makes it possible to use the wiring line as the light-shielding film of the optical black region (OB region). In that case, the wiring line is formed with a film thickness of approximately 250 nm in terms of light-shielding performance.

Incidentally, the organic photoelectric conversion film has weak adhesion to a backing and is thus easy to peel off due to stress when the light-shielding film is formed. Consequently, a stress buffer material including SiN, etc., for example, is formed between the organic photoelectric conversion film and the light-shielding film. The stress buffer material is formed with a film thickness of approximately 750 nm, for example. However, as the stress buffer material thickens, however, color mixture occurs because light collected on an on-chip lens enters adjacent pixels before reaching photoelectric conversion units, or vignetting occurs due to the light-shielding film provided between the adjacent pixels. Consequently, there is a possibility that optical properties deteriorate such as aggravated shading. Moreover, there is a possibility that flare ghost occurs due to reflection from the metal light-shielding film provided in a layer higher than the organic photoelectric conversion film.

In contrast to this, in the imaging device 1 of the present embodiment, the black layer 24 is provided on the light-shielding layer 22 that is provided on the organic photoelectric conversion layer 17 and provided from the optical black region (OB region) 110B of the pixel unit 100 to the surrounding region 200. This makes it possible to reduce the thickness of the light-shielding layer 22 from, for example, 250 nm to 200 nm, thus allowing for reduction of the stress of the light-shielding layer 22.

As described above, in the present embodiment, the black layer 24 is provided on the light-shielding layer 22 provided on the organic photoelectric conversion layer 17, which thus allows for film thinning of the light-shielding layer 22 and the reduction of the stress of the light-shielding layer 22. This makes it possible to reduce the thickness of the buffer layer 21 provided to alleviate the stress on the light-shielding layer 22 from, for example, 750 nm to 500 nm, by approximately 250 nm. Therefore, occurrence of the color mixture or the shading due to angled input into the adjacent pixels is reduced, which thus makes it possible to improve the optical properties.

In addition, in the imaging device 1 of the present embodiment, the provision of the black layer 24 attenuates the light inputted to the OB region 110B, for example, at the black layer 24. The attenuated light is reflected by the light-shielding layer 22 and taken out as reflected light to the outside via the black layer 24 again. This makes it possible to reduce a defect such as the flare ghost.

It is to be noted that, if the light-shielding layer 22 includes a relatively soft metal film such as aluminum (Al) in the imaging device 1 of the present embodiment, it is possible to further reduce the stress of the light-shielding layer 22, and further thin the film of the buffer layer 21.

Next, second to fourth embodiments are described. It is to be noted that components corresponding to the components of the first embodiment are denoted by same reference numerals, and description thereof is omitted.

2. SECOND EMBODIMENT

FIG. 6 schematically illustrates a cross-sectional configuration of an imaging device (imaging device 2) according to a second embodiment of the present disclosure. Similarly to the aforementioned first embodiment, the imaging device 2 is, for example, a CCD image sensor, a CMOS image sensor, or the like of a back-illuminated type (back light-receiving type), and has a pixel region (pixel unit 100) in which a plurality of unit pixels P is two-dimensionally disposed on a semiconductor substrate 11 (see FIG. 13). It is to be noted that FIG. 6 illustrates a cross-sectional configuration taken along the line I-I illustrated in FIG. 2. The imaging device 2 of the present embodiment differs from that of the aforementioned first embodiment in that a light-shielding layer 32 has a stacked structure with, for example, an insulating layer 33 stacked therebetween.

The light-shielding layer 32 is the wiring line for applying the voltage to the upper electrode 18 of the photoelectric converter 10 and is to define the black level. As illustrated above, the light-shielding layer 32 has a two-layer (light-shielding layers 32A and 32B) structure with the insulating layer 33 stacked therebetween. It is preferable that the lower light-shielding layer 32A be configured as the wiring layer with the light-shielding properties. The upper light-shielding layer 32B may be provided as a mere light-shielding film or may be provided as the wiring layer. It is desirable that a material of the light-shielding layer 32 include the material similar to that of the aforementioned light-shielding layer 22, for example, a single-layer film of a metal material such as tungsten (W), titanium (Ti), titanium nitride (TiN), and aluminum (Al), for example, or a laminated film thereof.

The light-shielding layer 32A and the light-shielding layer 32B may be formed by using the same materials or different materials. In addition, the light-shielding layer 32A and the light-shielding layer 32B may be electrically coupled to each other by a contact 32a, as illustrated in FIG. 6, for example. It is sufficient as the thickness of each of the light-shielding layer 32A and the light-shielding layer 32B if the two layers offer substantially the same light-shielding properties as those of the aforementioned light-shielding layer 22 when, for example, combined. Therefore, in a case where tungsten (W) is used, for example, it is preferable that each of the light-shielding layer 32A and the light-shielding layer 32B have a thickness of 50 nm or more and 150 nm or less, for example, although the thickness depends on a material to be included.

For example, the insulating layer 33 is to electrically insulate the light-shielding layer 32A and the light-shielding layer 32B, and is, for example, the single-layer film including any of silicon oxide (SiO), silicon nitride (SiN), silicon oxynitride (SiON), and the like, or the laminated film including two or more types thereof. The insulating layer 33 has a thickness of approximately 100 nm, for example, although the thickness is not designated in particular.

As described above, in the present embodiment, the light-shielding layer 32 has the two-layer structure, for example, and the insulating layer 33 is provided therebetween. This makes it possible to reduce an amount of films of the light-shielding layers 32A and 32B formed once. Therefore, it is possible to reduce the largest stress of the light-shielding layer 32A and the light-shielding layer 32B immediately after the film formation, and further reduce the thickness of the buffer layer 21.

In addition, forming the light-shielding layer 32 in a multilayer structure allows the light-shielding layer 32 to be used as a wiring layer other than the wiring line for applying the voltage to the upper electrode 18.

3. THIRD EMBODIMENT

FIG. 7 schematically illustrates a cross-sectional configuration of an imaging device (imaging device 3) in a third embodiment of the present disclosure. Similarly to the aforementioned first embodiment, the imaging device 3 is, for example, a CCD image sensor, a CMOS image sensor, or the like of a back-illuminated type (back light-receiving type), and has a pixel region (pixel unit 100) in which a plurality of unit pixels P is two-dimensionally disposed on a semiconductor substrate 11 (see FIG. 13). It is to be noted that FIG. 7 illustrates a cross-sectional configuration taken along the line I-I illustrated in FIG. 2. The imaging device 3 of the present embodiment differs from that of the afore- mentioned first embodiment in that an oxide film 42A is formed on a surface of a light-shielding layer 42.

The light-shielding layer 42 is the wiring line for applying the voltage to the upper electrode 18 of the photoelectric converter 10 and is to define the black level. Similarly to the aforementioned first embodiment, the light-shielding layer 42 includes the electrically-conductive material having the light shielding properties. Specifically, it is desirable that the light-shielding layer 42 include a single-layer film of a metal material such as tungsten (W), titanium (Ti), titanium nitride (TiN), and aluminum (Al), for example, or a laminated film thereof.

The oxide film 42A is to improve scattering intensity of a surface of the light-shielding layer 42 by changing periodicity of molecules included in the light-shielding layer 42. The oxide film 42A may be formed by oxidizing a surface of the light-shielding layer 42 or may be separately formed.

As descried above, in the present embodiment, the oxide film 42A is provided on the surface of the light-shielding layer 42. Thus, the scattering intensity of the surface of the light-shielding layer 42 improves, making it possible to reduce intensity of light reflected on the surface of the light-shielding layer 42. Therefore, further reduction of occurrence of the flare ghost is possible.

4. FOURTH EMBODIMENT

FIG. 8 schematically illustrates a cross-sectional configuration of an imaging device (imaging device 4) according to a fourth embodiment of the present disclosure. Similarly to the aforementioned first embodiment, the imaging device 4 is, for example, a CCD image sensor, a CMOS image sensor, or the like of a back-illuminated type (back light-receiving type), and has a pixel region (pixel unit 100) in which a plurality of unit pixels P is two-dimensionally disposed on a semiconductor substrate 11 (see FIG. 13). It is to be noted that FIG. 8 illustrates a cross-sectional configuration taken along the line I-I illustrated in FIG. 2. The imaging device 4 of the present embodiment differs from that of the aforementioned first embodiment in that a black layer 54 is provided to cover a side face of a step 22X that is generated by providing the light-shielding layer 22 on the buffer layer 21. The black layer 54 is formed to protrude toward the effective pixel region 110A side.

The black layer 54 is to block input of light into the OB region 110B. It is desirable that, similarly to the aforementioned first embodiment, materials of the black layer 54 have the light-shielding properties, and examples thereof include a black pigment such as the carbon black, blackened titanium oxide ($TiO_2$), a distributed type photosensitive resin, and an acrylic-based resin, and a mixed dye in which a plurality of colors is combined. It is preferable that the black layer 54 have a thickness of 200 nm or more and 1000 nm or less, for example. The black layer 54 of the present embodiment is formed to protrude toward the effective pixel region 110A side and cover the side face of the step 22X generated by providing the light-shielding layer 22 on the buffer layer 21.

In the aforementioned first embodiment or the like, provision of the light-shielding layer, the black layer 24, or the like on the buffer layer 21 generates a step in the on-chip lens layer 25 between the effective pixel region 110A and the OB region 110B. There is a possibility that this step deforms the on-chip lens 25L to be provided in the effective pixel region 110A or damages the black layer 24 when the on-chip lens 25L is formed. This causes a concern of occurrence of uneven sensitivity, or the like.

In contrast, in the present embodiment, the black layer 54 is formed to protrude toward the effective pixel region 110A side and cover the side face of the step 22X generated by providing the light-shielding layer 22 on the buffer layer 21. With this, provision of the light-shielding layer 22 or the black layer 54 makes it possible to reduce the step generated between the effective pixel region 110A and the OB region 110B. Therefore, it is possible to reduce occurrence of the uneven sensitivity or the like, and further improve the optical properties.

5. APPLICATION EXAMPLES

Application Example 1

FIG. 9 illustrates an overall configuration of the imaging device (imaging device 1) in which the photoelectric converter 10 described in the aforementioned first embodiment is used for the unit pixel P. This imaging device 1 is a CMOS image sensor, includes a pixel unit 1*a*, as an imaging area, on the semiconductor substrate 11, and includes a peripheral circuit unit 130 in a surrounding region of the pixel unit 1*a*. The peripheral circuit unit 130 includes, for example, a row scanning section 131, a horizontal selection section 133, a column scanning section 134, and a system control section 132.

The pixel unit 1*a* includes the plurality of unit pixels P (corresponding to the photoelectric converters 10) two-dimensionally disposed in matrix, for example. In these unit pixels P, pixel drive lines Lread (specifically, row selection lines and reset control lines) are disposed at each of pixel rows, for example, and vertical signal lines Lsig are disposed at each of pixel columns. The pixel drive lines Lread are each used to transmit drive signals for reading signals from pixels. One end of each of the pixel drive lines Lread is coupled to the output end of the row scanning section 131 corresponding to each row.

The row scanning section 131 includes a shift register, an address recorder, and the like, and is a pixel drive section that drives each of the unit pixels P of the pixel unit 1*a* on a row basis, for example. A signal outputted from each of the unit pixels P of the pixel rows selected and scanned by the row scanning section 131 is supplied to the horizontal selection section 133 through each of the vertical signal lines Lsig. The horizontal selection section 133 includes an amplifier, a horizontal selection switch, and the like provided for each of the vertical signal lines Lsig.

The column scanning section 134 includes a shift register, an address decoder, and the like, and drives each of the horizontal selection switches of the horizontal selection section 133 in sequence while scanning the horizontal selection switches. Selection and scanning by this column scanning section 134 outputs signals of the respective pixels transmitted through each of the vertical signal lines Lsig to a horizontal signal line 135 in sequence, and transmits the signals to outside of the semiconductor substrate 11 through the horizontal signal line 135.

Circuit portions including the row scanning section 131, the horizontal selection section 133, the column scanning section 134, and the horizontal signal line 135 may be formed directly on the semiconductor substrate 11 or may be disposed on external control IC. In addition, those circuit portions may be formed on another substrate coupled by a cable or the like.

The system control section 132 receives a clock to be given from the outside of the semiconductor substrate 11, data that gives an instruction about an operation mode, or the like, and also outputs data such as internal information of the imaging device 1. The system control section 132 further includes a timing generator that generates various timing signals, and controls the driving of the peripheral circuit such as the row scanning section 131, the horizontal selection section 133, the column scanning section 134, and the like on the basis of the various timing signals generated by the timing generator.

Application Example 2

The aforementioned imaging device 1 is applicable to any types of imaging apparatuses with an imaging function including, for example, a camera system such as a digital still camera or a video camera, a mobile phone having the imaging function, and the like. FIG. 10 illustrates a schematic configuration of an imaging apparatus 5 (camera) by way of example thereof. This imaging apparatus 5 is a video camera that is able to take a still image or a moving image, for example, and includes the imaging device 1, an optical system (optical lens) 310, a shutter 311, a drive unit 313 that drives the imaging device 1 and the shutter 311, and a signal processing unit 312.

The optical system 310 guides image light (light inputted) from an object to the pixel unit 1*a* of the imaging device 1. This optical system 310 may include a plurality of optical lenses. The shutter 311 controls a period of light application to the imaging device 1 and a light-shielding period. The drive unit 313 controls a transfer operation of the imaging device 1 and a shutter operation of the shutter 311. The signal processing unit 312 performs various types of signal processing on a signal outputted from the imaging device 1. An image signal Dout subjected to the signal processing is stored in a storage medium such as a memory or outputted to a monitor or the like.

Furthermore, the aforementioned imaging device 1 is also be applicable to an electronic apparatus (a capsule type endoscope 10100 and a mobile object such as a vehicle) to be described below.

Application Example 3

<Example of Application to In-Vivo Information Acquisition System>

FIG. 11 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 11, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

An example of the in-vivo information acquisition system to which the technology according to the present disclosure may be applied has been described above. The technology according to the present disclosure may be applied, for example, to the image pickup unit 10112 among the components described above. This allows for acquisition of an elaborate image of an affected region, thus improving precision of the inspection.

Application Example 4

<Example of Application to Mobile Body>

The technology (the present technology) according to the present disclosure is applicable to a variety of products. For example, the technology according to the present disclosure may be achieved as an apparatus mounted on any type of mobile body such as an automobile, an electric vehicle, a hybrid electric vehicle, a motorcycle, a bicycle, a personal mobility, an airplane, a drone, a vessel, or a robot.

FIG. 12 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 12, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 12, an audio speaker 12061, a display section 12062, and an instrument panel 12063 are illustrated as the output device. The display section 12062 may, for example, include at least one of an on-board display and a head-up display.

FIG. 13 is a diagram depicting an example of the installation position of the imaging section 12031.

In FIG. 13, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 13 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Description has been given above with reference to the first to fourth embodiments and the application examples. The contents of the present disclosure are not, however, limited to the embodiments or the like described above. A variety of modifications may be made. For example, although the aforementioned embodiments each have a configuration in which the organic photoelectric conversion unit 11G that detects the green light and the inorganic photoelectric conversion units 11B and 11R that respectively detect the blue light and the red light are stacked as the photoelectric converter 10, contents of the present disclosure are not limited to such a structure. That is, the organic photoelectric conversion unit may detect the red light or the blue light, or the inorganic photoelectric conversion unit may detect the green light.

In addition, the number of these organic photoelectric conversion units and inorganic photoelectric conversion units or a proportion thereof are not limited. The two or more organic photoelectric conversion units may be provided or color signals of a plurality of colors may be obtained only with the organic photoelectric conversion unit. Furthermore, a structure is not limited to the structure in which the organic photoelectric conversion unit and the inorganic photoelectric conversion units are stacked in the vertical direction, but the organic photoelectric conversion unit and the inorganic photoelectric conversion unit may be placed side by side along a substrate surface.

Yet furthermore, although the aforementioned first to fourth embodiments exemplarily illustrate the configuration of the imaging device of the back-illuminated type, the contents of the present disclosure are also applicable to the imaging device of a front-illuminated type. In addition, the imaging device (photoelectric converter) of the present disclosure does not have to include all of the respective components described in the aforementioned embodiments, but may include another layer, to the contrary.

It is to be noted that the effects described herein are merely examples, but not limitative. In addition, there may be other effects.

It is to be noted that the present disclosure may have the following configurations.

(1)
An imaging device including:
a pixel region in which a plurality of pixels is disposed;
a surrounding region provided around the pixel region;

an organic photoelectric conversion layer continuously provided from the pixel region to a portion of the surrounding region;

an electrically-conducive layer provided on the organic photoelectric conversion layer from a periphery of the pixel region to the surrounding region, the electrically-conducive layer having a light-shielding property; and a black layer provided on the electrically-conducive layer.

(2)

The imaging device according to (1), in which a stress buffer layer is provided between the organic photoelectric conversion layer and the electrically-conducive layer.

(3)

The imaging device according to (1) or (2), in which the electrically-conducive layer and the black layer are stacked via a first insulating layer.

(4)

The imaging device according to (3), in which the first insulating layer is a protective layer provided on the organic photoelectric conversion layer in the pixel region, the protective layer extending from the pixel region.

(5)

The imaging device according to any of (1) to (4), in which the electrically-conducive layers have a multilayer structure with a second insulating layer provided between the electrically-conducive layers.

(6)

The imaging device according to (5), in which the electrically-conducive layers having the multilayer structure are electrically coupled to each other.

(7)

The imaging device according to any of (1) to (6), in which the electrically-conducive layer has an oxide film formed on a surface.

(8)

The imaging device according to any of (1) to (7), in which the pixel region includes an effective pixel region and an optical black region provided in a periphery of the effective pixel region.

(9)

The imaging device according to (8), in which the pixel region has a step between the effective pixel region and the optical black region, the step being high on the optical black region side and low on the effective pixel region side, and a side face of the step is covered by the black layer.

(10)

The imaging device according to any of (1) to (9), in which the pixel region includes a photoelectric conversion unit, the photoelectric conversion unit including the organic photoelectric conversion layer and a pair of electrodes, the pair of electrodes being opposed to each other with the organic photoelectric conversion layer between the pair of electrodes, and the electrically-conducive layer is electrically coupled to one of the pair of electrodes.

(11)

An imaging apparatus including an imaging device including a pixel region in which a plurality of pixels is disposed, a surrounding region provided around the pixel region, an organic photoelectric conversion layer continuously provided from the pixel region to a portion of the surrounding region, an electrically-conducive layer provided on the organic photoelectric conversion layer from a periphery of the pixel region to the surrounding region, the electrically-conducive layer having a light-shielding property, and a black layer provided on the electrically-conducive layer.

This application claims the priority on the basis of Japanese Patent Application No. 2017-132013 filed with Japan Patent Office on Jul. 5, 2017, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An imaging device, comprising:
   a pixel region that includes a plurality of pixels;
   a surrounding region around the pixel region;
   an organic photoelectric conversion layer that extends from the pixel region to a portion of the surrounding region;
   an electrically-conducive layer on the organic photoelectric conversion layer from a periphery of the pixel region to the surrounding region, wherein the electrically-conducive layer has light-shielding property;
   a black layer on the electrically-conducive layer; and
   a first insulating layer, wherein a portion of the first insulating layer is between the electrically-conducive layer and the black layer.

2. The imaging device according to claim 1, further comprising a stress buffer layer between the organic photoelectric conversion layer and the electrically-conducive layer.

3. The imaging device according to claim 1, wherein
   the first insulating layer is a protective layer,
   the first insulating layer is on the organic photoelectric conversion layer in the pixel region, and
   the protective layer extends from the pixel region.

4. The imaging device according to claim 1, further comprising a second insulating layer, wherein
   the electrically-conducive layer has a multilayer structure, and
   the second insulating layer is between a first layer of the multilayer structure and a second layer of the multilayer structure.

5. The imaging device according to claim 4, wherein the first layer and the second layer are electrically coupled.

6. The imaging device according to claim 1, further comprising an oxide film on a surface of the electrically-conducive layer.

7. The imaging device according to claim 1, wherein the pixel region includes:
   an effective pixel region; and
   an optical black region in a periphery of the effective pixel region.

8. The imaging device according to claim 7, wherein
   the pixel region has a step between the effective pixel region and the optical black region,
   the step is high on a side of the optical black region and low on a side of the effective pixel region, and
   the black layer covers a side face of the step.

9. The imaging device according to claim 1, wherein
   the pixel region includes a photoelectric conversion unit,
   the photoelectric conversion unit includes the organic photoelectric conversion layer and a pair of electrodes,
   a first electrode of the pair of electrodes is opposite to a second electrode of the pair of electrodes with the organic photoelectric conversion layer between the pair of electrodes, and the electrically-conducive layer is electrically coupled to one of the pair of electrodes.

10. An imaging apparatus, comprising:
an imaging device including:
- a pixel region that includes a plurality of pixels;
- a surrounding region around the pixel region;
- an organic photoelectric conversion layer that from the pixel region to a portion of the surrounding region;
- an electrically-conducive layer on the organic photoelectric conversion layer from a periphery of the pixel region to the surrounding region, wherein the electrically-conducive layer has light-shielding property;
- a black layer on the electrically-conducive layer; and
- an insulating layer, wherein a portion of the insulating layer is between the electrically-conducive layer and the black layer.

* * * * *